(12) United States Patent
Cekli et al.

(10) Patent No.: US 11,175,591 B2
(45) Date of Patent: Nov. 16, 2021

(54) METHOD OF OBTAINING MEASUREMENTS, APPARATUS FOR PERFORMING A PROCESS STEP, AND METROLOGY APPARATUS

(71) Applicant: ASML NETHERLANDS B.V., Veldhoven (NL)

(72) Inventors: Hakki Ergün Cekli, Singapore (SG); Masashi Ishibashi, Eindhoven (NL); Wendy Johanna Martina Van De Ven, Heesch (NL); Willem Seine Christian Roelofs, Deurne (NL); Elliott Gerard McNamara, Eindhoven (NL); Rizvi Rahman, Bundang-Gu (KR); Michiel Kupers, Roermond (NL); Emil Peter Schmitt-Weaver, Eindhoven (NL); Erik Henri Adriaan Delvigne, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/098,165

(22) PCT Filed: Apr. 21, 2017

(86) PCT No.: PCT/EP2017/059474
§ 371 (c)(1),
(2) Date: Nov. 1, 2018

(87) PCT Pub. No.: WO2017/194289
PCT Pub. Date: Nov. 16, 2017

(65) Prior Publication Data
US 2019/0137892 A1    May 9, 2019

(30) Foreign Application Priority Data

May 12, 2016  (EP) ..................................... 16169384
Sep. 12, 2016  (EP) ..................................... 16188380
Mar. 29, 2017  (EP) ..................................... 17163586

(51) Int. Cl.
*G03F 7/20* (2006.01)
*G01N 21/956* (2006.01)
(Continued)

(52) U.S. Cl.
CPC ....... *G03F 7/70633* (2013.01); *G01N 21/956* (2013.01); *G03F 9/7046* (2013.01); *H01L 22/12* (2013.01); *H01L 22/20* (2013.01)

(58) Field of Classification Search
CPC ....... G01N 21/956; H01L 22/12; H01L 22/20; G03F 7/70633; G03F 9/7046
See application file for complete search history.

(56) References Cited

U.S. PATENT DOCUMENTS

| 6,754,593 | B1 | 6/2004 | Stewart et al. |
| 10,234,401 | B2 * | 3/2019 | Buhl .................. H01L 22/20 |

(Continued)

FOREIGN PATENT DOCUMENTS

| CN | 102650832 | 8/2012 |
| CN | 102692829 | 9/2012 |

(Continued)

OTHER PUBLICATIONS

Taiwanese Office Action issued in corresponding Taiwanese Patent Application No. 106115403, dated Jan. 29, 2019.
(Continued)

*Primary Examiner* — Deoram Persaud
(74) *Attorney, Agent, or Firm* — Pillsbury Winthrop Shaw Pittman LLP

(57) ABSTRACT

Measurements are obtained from locations across a substrate before or after performing a lithographic process step. Examples of such measurements include alignment measurements made prior to applying a pattern to the substrate,
(Continued)

and measurements of a performance parameter such as overlay, after a pattern has been applied. A set of measurement locations is selected from among all possible measurement locations. At least a subset of the selected measurement locations are selected dynamically, in response to measurements obtained using a preliminary selection of measurement locations. Preliminary measurements of height can be used to select measurement locations for alignment. In another aspect, outlier measurements are detected based on supplementary data such as height measurements or historic data.

24 Claims, 12 Drawing Sheets

(51) Int. Cl.
*G03F 9/00* (2006.01)
*H01L 21/66* (2006.01)

(56) References Cited

U.S. PATENT DOCUMENTS

| | | |
|---|---|---|
| 2002/0193899 A1 | 12/2002 | Shanmugasundram et al. |
| 2008/0163140 A1 | 7/2008 | Fouquet et al. |
| 2010/0175033 A1 | 7/2010 | Adel et al. |
| 2011/0170091 A1 | 7/2011 | Chang et al. |
| 2011/0199596 A1 | 8/2011 | Middlebrooks |
| 2011/0202298 A1 | 8/2011 | Izikson et al. |
| 2012/0008127 A1 | 1/2012 | Tel et al. |
| 2012/0057171 A1 | 3/2012 | Khuat Duy |
| 2012/0218533 A1 | 8/2012 | Lyulina et al. |
| 2013/0230797 A1 | 9/2013 | Van Der Sanden et al. |
| 2013/0310966 A1 | 11/2013 | MacNaughton et al. |
| 2014/0354969 A1 | 12/2014 | Elings et al. |
| 2015/0248127 A1 | 9/2015 | Yang et al. |
| 2016/0274036 A1 | 9/2016 | Plihal |
| 2016/0313651 A1 | 10/2016 | Middlebrooks et al. |
| 2017/0160653 A1 | 6/2017 | Nakiboglu et al. |
| 2018/0181011 A1 | 6/2018 | Van Hoof et al. |
| 2019/0064680 A1* | 2/2019 | Schmitt-Weaver ..... G03F 7/705 |
| 2019/0079414 A1* | 3/2019 | Straaijer ............. G03F 7/70633 |
| 2019/0137892 A1 | 5/2019 | Cekli et al. |
| 2019/0243252 A1* | 8/2019 | Frisco ................. G03F 7/70616 |
| 2019/0278188 A1* | 9/2019 | Ypma ...................... G06F 16/26 |
| 2020/0050180 A1* | 2/2020 | Kou .................... G03F 7/70525 |
| 2020/0233315 A1* | 7/2020 | Nije ..................... G06K 9/6247 |

FOREIGN PATENT DOCUMENTS

| | | |
|---|---|---|
| CN | 103207528 | 7/2013 |
| CN | 103513187 | 1/2014 |
| CN | 104516206 | 4/2015 |
| CN | 107735731 | 2/2018 |
| KR | 2011-0095363 | 8/2011 |
| KR | 2014-0083055 | 7/2014 |
| KR | 2015-0103578 | 9/2015 |
| TW | 201142531 | 12/2011 |
| TW | 201219994 | 5/2012 |
| TW | 201243507 | 11/2012 |
| TW | 201530333 | 8/2015 |
| TW | 201606448 | 2/2016 |
| TW | I668518 | 8/2019 |
| WO | 2015049087 | 4/2015 |
| WO | 2015110191 | 7/2015 |

OTHER PUBLICATIONS

International Search Report and Written Opinion issued in corresponding PCT Patent Application No. PCT/EP2017/059474, dated Jul. 19, 2017.
Taiwanese Office Action issued in corresponding Taiwanese Patent application No. 106115403, dated May 29, 2018.
Hierarchical clustering, Wikipedia, Mar. 28, 2017.
Schmitt-Weaver, Emil, et al.: "Computational overlay metrology with adaptive data analytics", Paper 10145-31, Presented at SPIE Advanced Lithography 2017, San Jose, California, United States, Feb. 26-Mar. 2, 2017.
Chinese Office Action issued in corresponding Chinese Patent Application No. 201780029363X, dated Nov. 9, 2020.
Chinese Office Action and Search Report issued in corresponding Chinese Patent Application No. 201780029363.X, dated Mar. 16, 2020.
Korean Office Action and Search Report issued in corresponding Korean Patent Application No. 10-2018-7035584, dated May 6, 2020.
Taiwanese Office Action issued in corresponding Taiwanese Patent Application No. 108121795, dated Jun. 21, 2021.

\* cited by examiner (a)  (b)

(a)                          (b)

(a)

(b)

METHOD OF OBTAINING MEASUREMENTS, APPARATUS FOR PERFORMING A PROCESS STEP, AND METROLOGY APPARATUS

CROSS-REFERENCE TO RELATED APPLICATIONS

This application is the U.S. National Phase entry of PCT/EP2017/059474, which was filed on Apr. 21, 2017, which claims the benefit of priority of European patent application no. EP16169384, which was filed on May 12, 2016, European patent application no. EP16188380, which was filed on Sep. 12, 2016, and European patent application no. EP17163586, which was filed on Mar. 29, 2017, each of which is incorporated herein in its entirety by reference.

BACKGROUND

Field of the Invention

The present invention relates to methods of obtaining measurements from locations across one or more substrates. The invention can be applied for example in a lithographic apparatus, or in a metrology apparatus. The present invention further relates to methods of manufacturing devices using such lithographic apparatus, and to data processing apparatuses and computer program products for implementing parts of such a method.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A key performance parameter of the lithographic process is the overlay error. This error, often referred to simply as "overlay", is the error in placing product features in the correct position relative to features formed in previous layers. As device structures become ever smaller, overlay specifications become ever tighter.

Within the lithographic apparatus, wafer alignment models are conventionally applied based on measurement of alignment marks provided on the substrate, the measurements being made as a preliminary step of every patterning operation. The alignment models nowadays include higher order models, to correct for non-linear distortions of the wafer. The alignment models may also be expanded to take into account other measurements and/or calculated effects such as thermal deformation during a patterning operation. However, the time available per wafer does not permit measurement of all the alignment marks, and a compromise between speed and accuracy inevitably has to be made.

Currently the overlay error is controlled and corrected by means of methods such as advanced process control (APC) described for example in US2012008127A1 and wafer alignment models described for example in US2013230797A1. The advanced process control techniques have been introduced in recent years and use measurements of metrology targets applied to substrates alongside the applied device pattern. The inspection apparatus may be separate from the lithographic apparatus, or integrated within it.

While alignment models and advanced process control have brought great reductions in overlay, not all errors are corrected. Some of these errors may be uncorrectable noise, for example, but others are correctable using available techniques in theory, but not economically correctable in practice. For example, one can envisage yet higher order models, but these in turn would require a higher spatial density of position measurements. Again, even if there is a high spatial density of possible measurement locations, to actually measure such a number of measurement locations would adversely affect throughput of the lithographic process of the metrology apparatus.

Accordingly, it is common to define a measurement "recipe" that captures the most important features of a substrate, from the point of view of improving the key performance parameters, such as overlay. If it is known that a certain type of processing gives rise to a particular "fingerprint" in the distortions of the substrates that undergo that process, the set of measurement locations can be selected to capture that fingerprint in a way that maximizes the chance correcting for it in the patterning step. A problem arises, however, in that the process fingerprints can vary quite widely even with a single lot of wafers. The set of measurement locations that gives good overlay performance for one wafer may not give good overlay performance for the next one. The same principles apply to the selection of measurement locations in a metrology application, on substrates that have already been subject to the lithographic process.

Another problem that affects both alignment and metrology performance is that of anomalous samples or "outliers". In the alignment data, an outlier may be a position measurement influenced by a very localized cause such as contamination under the wafer. When this measurement is included in the alignment model, however, the influence of the anomalous measurement may spread, degrading overlay performance over and unduly wide area. Similarly, outliers in performance metrology may cause noise and degradation in advanced performance control loops.

SUMMARY OF THE INVENTION

The present invention has the aim of improving relevance of measurement results (primarily relevance for performance of a lithographic process) without necessarily increasing the number of measurement locations required to be measured.

According to an aspect of the invention, there is provided a method of obtaining measurements from locations across a substrate before or after performing a lithographic process step, wherein a set of measurement locations is selected from among all possible measurement locations, and at each selected location a measurement is made of a property of a structure on the substrate, wherein at least a subset of the selected measurement locations is selected dynamically at least partly in response to recognition of a fingerprint associated with measurements obtained using a preliminary selection of measurement locations.

Dynamic selection of the set of measurement locations allows the locations that are most likely to be relevant for performance improvement to be selected on a per-substrate basis, without necessarily increasing the total number of measurements and measurement time. The performance penalty that might otherwise be expected to result from choosing a limited set of measurement locations can be reduced, even in the presence of process variation between substrates.

The lithographic process step may be a patterning step performed in a lithographic apparatus, or it may be a chemical or physical processing step performed in another apparatus.

The measurements made at the preliminary selection of measurement locations and/or the measurements made at the selected set of measurement locations may be made within the lithographic apparatus or other processing apparatus, or they may be made in a separate metrology apparatus.

The measurements made at the preliminary selection of measurement locations may be of the type of measurement as the measurements obtained at the selected set of measurement locations, or a different type. The measurements made at the preliminary selection of measurement locations may made in the same apparatus as the measurements obtained at the selected set of measurement locations, or a different apparatus.

In some examples disclosed herein, locations for alignment measurements (which measure positional deviations in the plane of the substrate) are dynamically selected based on alignment measurements at preliminary locations. In other examples, locations for alignment measurements are dynamically selected based on height measurements (out-of-plane positional deviations).

Examples of measurements made before a lithographic process step include alignment measurements made for positioning a pattern to be applied in a lithographic apparatus. Examples of measurements made after a lithographic process step include measurements of performance parameter such as overlay.

The invention further provides an apparatus for performing a process step in a lithographic process, the apparatus including a measurement system for making measurement of a substrate prior to performing said process step, the measurement system being arranged to obtain measurements at a selected set of locations across the substrate using a method according to the invention as set forth above.

The invention further provides a metrology apparatus arranged to obtain measurements of one or more properties of structures at a selected set of locations across a substrate using a method according to the invention as set forth above.

The invention further provides a method of manufacturing devices including a lithographic process step, wherein, before or after performing said lithographic process step, measurements are obtained at a selected set of locations across a substrate by a method according to the invention as set forth above, and wherein the obtained measurements are used to adjust parameters of the lithographic process step for the processing of the substrate and/or further substrates.

The invention in a further, independent aspect provides a method of determining a weighting factor for a measurement made at a measurement location on a substrate, the method comprising the steps of:

applying a quality test to the measurement, the quality test being based at least partly on supplementary data associated with the measurement location; and determining the weighting factor based on a result of said quality test.

The supplementary data in some embodiments comprises statistical data based on previously processed substrates. The weighting factor can be exploited in various ways, for example to reduce the influence of outlier measurements on future processing.

The apparatus and method of the invention can be implemented in some embodiments by modifying control software of existing apparatuses.

The invention further provides a computer program product comprising machine-readable instructions for causing one or more processors to implement aspects of the method in the apparatus set forth above. The computer program product may comprise said machine readable instructions stored in a non-transitory storage medium.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
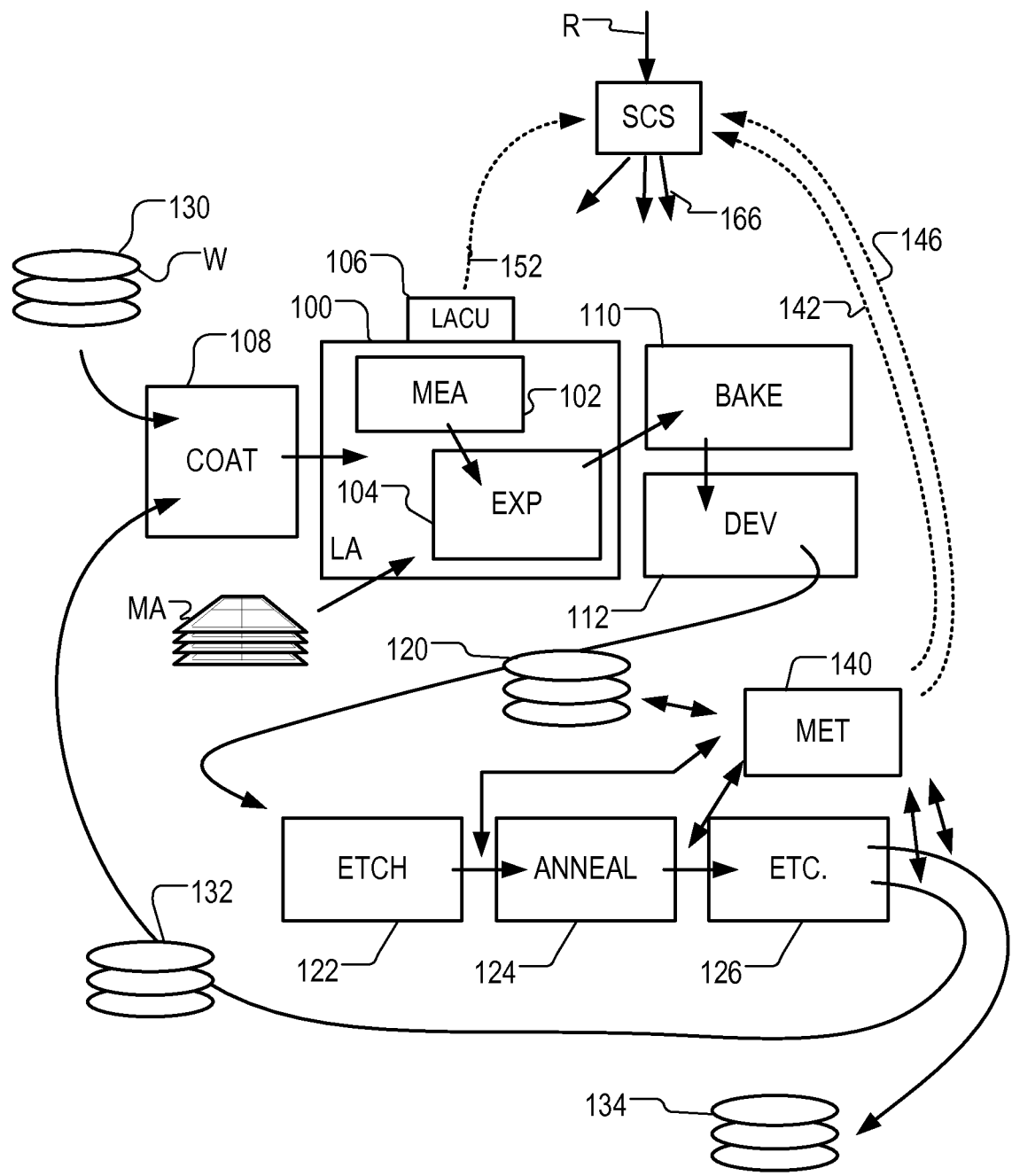
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Alternatively, the measurement station and exposure station can be combined. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

The present disclosure concerns the dynamic selection of measurement locations, in cases where the time available for a set of measurements does not permit measurement of all possible locations across the substrate. This dynamic selection can be applied in various operations in the manufacturing facility of FIG. 1. For example, the techniques can be applied in the selection of measurement locations when measuring alignment marks on the substrates, as part of the patterning operation. Alternatively, or in addition, the dynamic selection of measurement locations can be applied to the selection of metrology targets in the metrology apparatus 140. A detailed example will be described in the context of alignment, which can then be readily applied in metrology apparatus 140, in a similar manner.

Alignment Process Background

Figure 2:
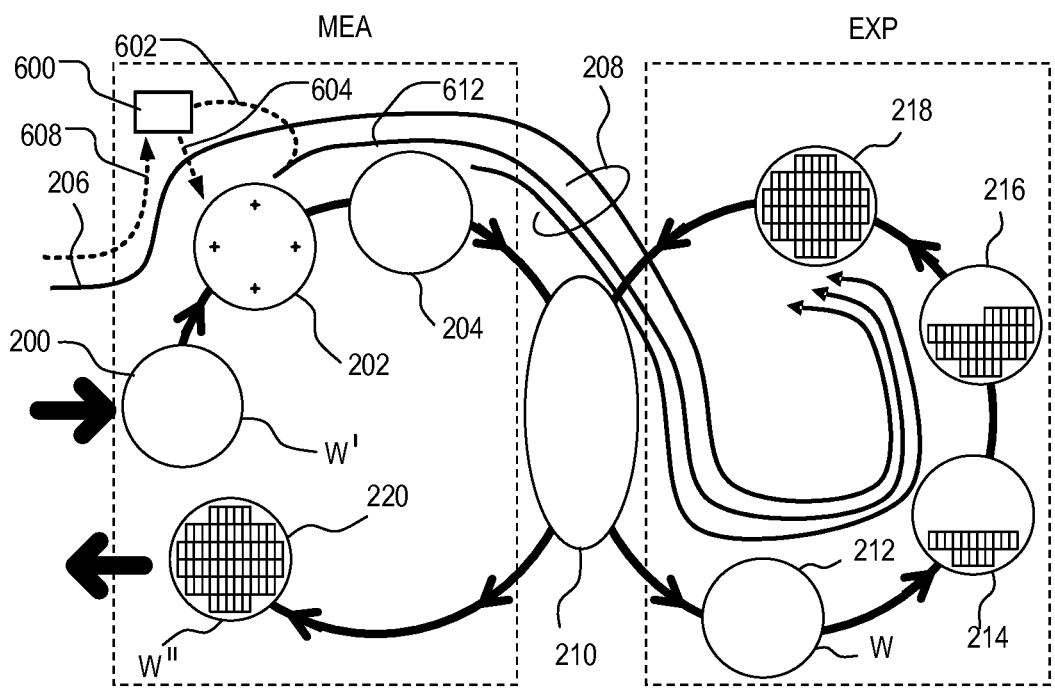
FIG. 2 illustrates schematically measurement and exposure processes in the lithographic apparatus of FIG. 1, according to known practice and modified in accordance with an embodiment of the present invention.

FIG. 2 illustrates the steps to expose target portions (e.g. dies) on a substrate W in the dual-stage type of lithographic apparatus, used in the example of FIG. 1. The process according to conventional practice will be described first. The present disclosure is not limited to dual-stage apparatus. The dynamic selection technique disclosed herein can be applied in any situation where time does not permit measurements of any type to be measured at all possible measurement locations on every substrate.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Selection of Measurement Locations

Figure 3:
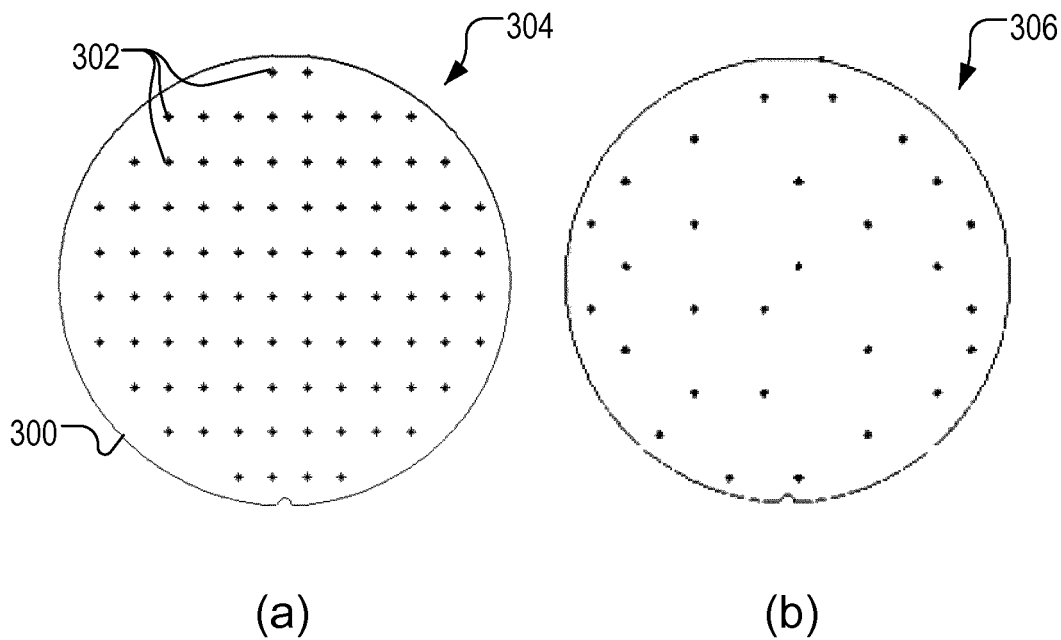
FIG. 3 shows (a) the distribution of measurement locations available for measurement on an example wafer and (b) an example set of measurement locations, selected for measurement during high-volume manufacture.

Referring to FIG. 3 (*a*), substrate 300 may be the substrate W' currently undergoing alignment measurements at step 202. An array of points 302 represent possible measurement locations distributed across a substrate 300. In the alignment measurements step 202 of FIG. 2, this array of points would correspond to the full set of alignment marks distributed across the substrate. In another embodiment, they may represent a different type of metrology target structure, for example in overlay or focus measurement target. The possible measurement locations need not be defined by any specific structure, where metrology can be performed for example on the blank substrate or on the product structures themselves. In the illustrated example, there are 90 alignment marks, and consequently 90 possible measurement locations for the alignment sensor of the lithographic apparatus to be used in the step 202.

In the performance of step 202, a set of measurement locations is generally selected, which is less than the full set 304 of possible measurement locations. This is because the time taken in the step 202 must fit within the overall cycle time of the wafers at the measurement station and the exposure station, or else throughput of the apparatus will be degraded. In the example of FIG. 3 (*b*), a selected set 306 of measurement locations comprises for example 28 locations from among the full set of 90 possible locations. In a conventional process, this selection is defined in the recipe data 206, delivered with the substrate W' in the loading step 200. The recipe is generally the same for all substrates in a batch, although it will generally be customized for each type of product and layer. The skilled reader will understand that the numbers such as 90 and 28 in this example are purely given by way of example, and it is a matter for the manufacturer to determine how many measurement locations there will be a given substrate, and how many of those should be measured per substrate. In the case of a typical semiconductor wafer processing facility, the total possible measurement points might be in the range 70, 80 or 100, for example, while the number selected for measurement during high-volume manufacturing may be, for example in the range 20, 30 or 40. These numbers are mentioned purely for illustration, and no particular number is significant.

Figure 4:
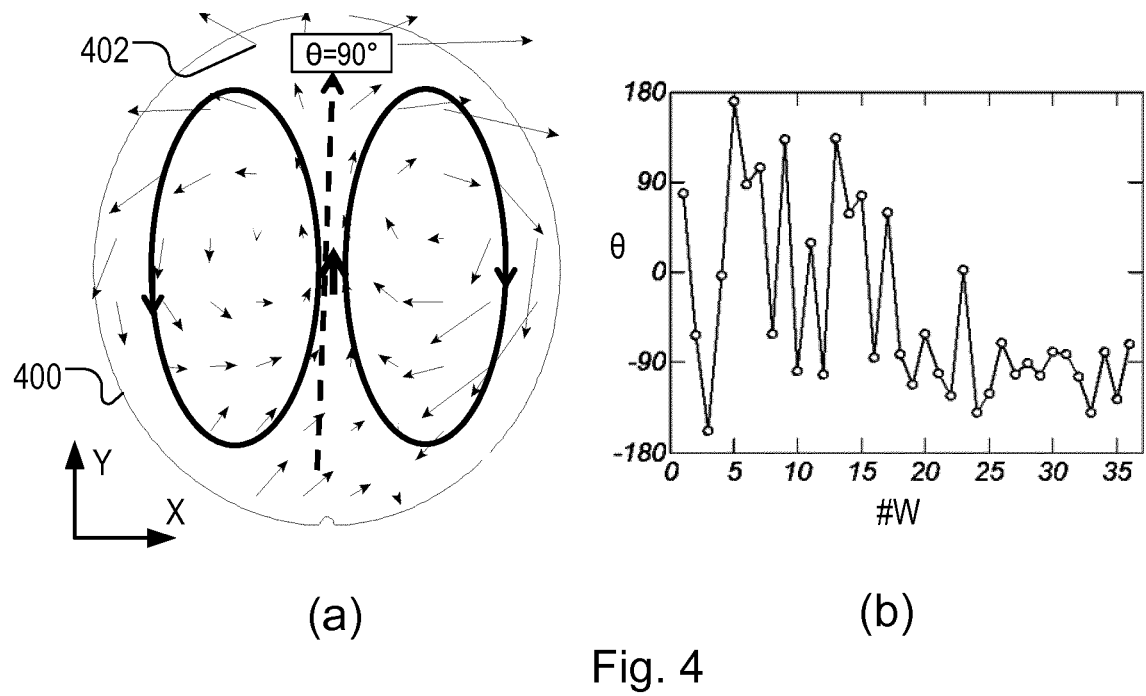
FIG. 4 illustrates (a) an example of a process-induced fingerprint on a semiconductor wafer, and (b) variation of the fingerprint between wafers in a sample of wafers taken from several lots.

FIG. 4 (a) represents the values of positional deviations that may be measured using the alignment marks at a plurality of measurement locations across a simulated substrate 400. It can be seen that the distribution of positional deviations in the X and Y directions is not random, but exhibits a recognizable "fingerprint". In this case the fingerprint is summarized by the two oval shapes superimposed on the diagram. The measured deviations describe a generally counterclockwise distortion in one half of the substrate, and a generally clockwise distortion in the other half. In this example, the halves are arranged at the left and right, and we can say that this pattern exhibits a "swirl angle" of θ=90°. Such fingerprints arise, for example, from thermal processing steps outside the lithographic apparatus. Other types of thermal fingerprint might be observed, and other types of fingerprint from different processing steps.

The measurements in FIG. 4 (a) are derived from a fairly full set of possible measurement locations. In order to define a reduced set of measurement locations, which still captures maximum information about the distortions of the particular substrate, the set of selected measurement locations illustrated in FIG. 3 (b) should ideally be defined based on knowledge of the particular fingerprint affecting the substrate.

FIG. 4 (b) illustrates a problem with this approach, however. The swirl angle θ is plotted on the vertical axis, and a substrate ID is plotted along the horizontal axis, for a sample of 36 different substrates. The 36 substrates in this example comprise six sample substrates from each of six sample lots. All the lots relate to the same product and layer. The swirl angle θ can be seen to vary quite widely from individual substrate to individual substrate. The amplitude of the swirl pattern may also vary from wafer to wafer, of course. It follows from this observation that a selected set of measurement locations optimized for the fingerprint on one substrate may not be optimal for the fingerprint on another substrate. If the fingerprint were known in advance, it may be possible to define a customized selection of measurement locations as part of the recipe data 206 for each substrate. However, apart from the possibility to predict the fingerprint somewhat from the history of processing steps to which a substrate has been selected, there would be no way to know the individual fingerprint, without incurring additional measurement burden.

Figure 5:
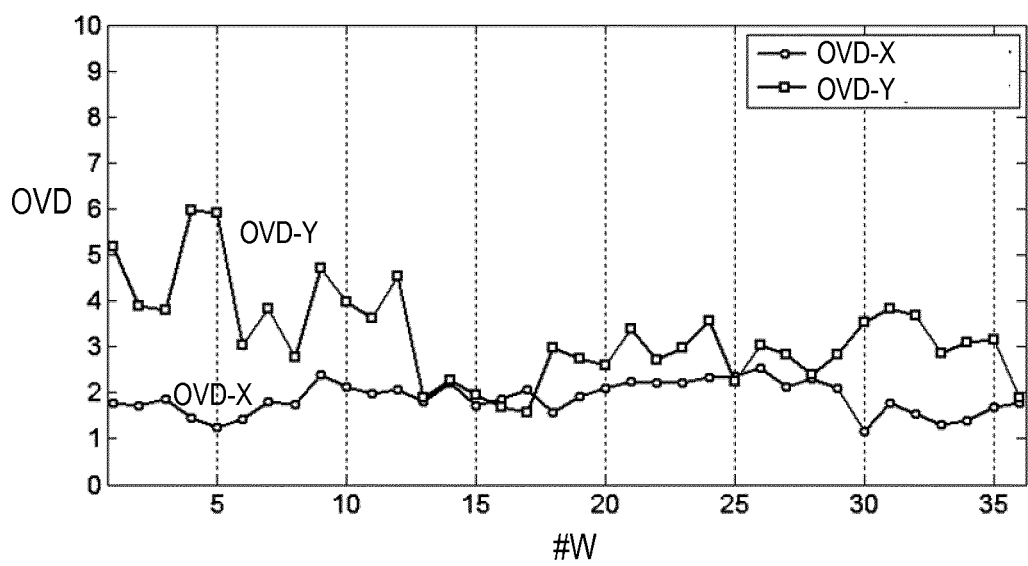
FIG. 5 illustrates deviation of performance parameters of the lithographic process, attributable to using the selected set of measurement locations, over the same sample of wafers shown in FIG. 4 (b)

FIG. 5 illustrates the consequence of this wafer-to-wafer fingerprint variation, in terms of the performance parameter overlay. The same 36 substrates are plotted from left to right on the horizontal axis. Overlay deviation OVD is plotted separately for the X direction and the Y direction, on an arbitrary vertical scale. It will be remembered that the set of measurements taken will be passed to an alignment model, and used to control the positioning of patterns on the substrate. Overlay deviation in this example is defined as the difference between overlay performance obtained via the alignment model using the smaller number of selected measurement locations, compared with the performance that would have been obtained had all possible measurement locations being used, or a significantly greater number at any rate.

FIG. 5 shows that, in the X direction, there is a certain overlay deviation due to use of a small selected set of measurement locations, but the variation between wafers and the sample is not very great. In the Y direction, however, there are some much greater overlay deviations attributable to the use of the small selected set, and these are strongly variable from wafer to wafer.

Dynamic Selection of Measurement Locations—Alignment Example

Reverting briefly to FIG. 2, some additional steps are shown there, which allow a dynamic selection of measurement locations to be performed, for each individual substrate if desired, so as to achieve better performance without increasing the total number of measurement locations, and hence the total measurement type. A dynamic selection function is labeled 600 in FIG. 2. This function, which may be an added module within existing control software of the apparatus receives as input positional deviations (alignment measurements) measured at a preliminary selection of measurement locations on the substrate. The dynamic selection function quickly processes these measurements and determines a dynamic selection 604 to be used for completion of the alignment measurements step 202. The dynamic selection can be performed in a manner defined in the recipe data 206. It can also be defined at least partly by reference to context data 608, which may describe, for example, the processing history of the substrate. It may even describe directly fingerprints previously observed or expected in the individual substrate.

In a simple embodiment, the preliminary selection of measurement locations may be a first subset of the final selection, and one or more further subsets of the final selection can be added in response to the measurement results obtained with the preliminary selection, and any additional subsets. An example of such a method will be described now, with reference to FIG. 6.

Figure 6:
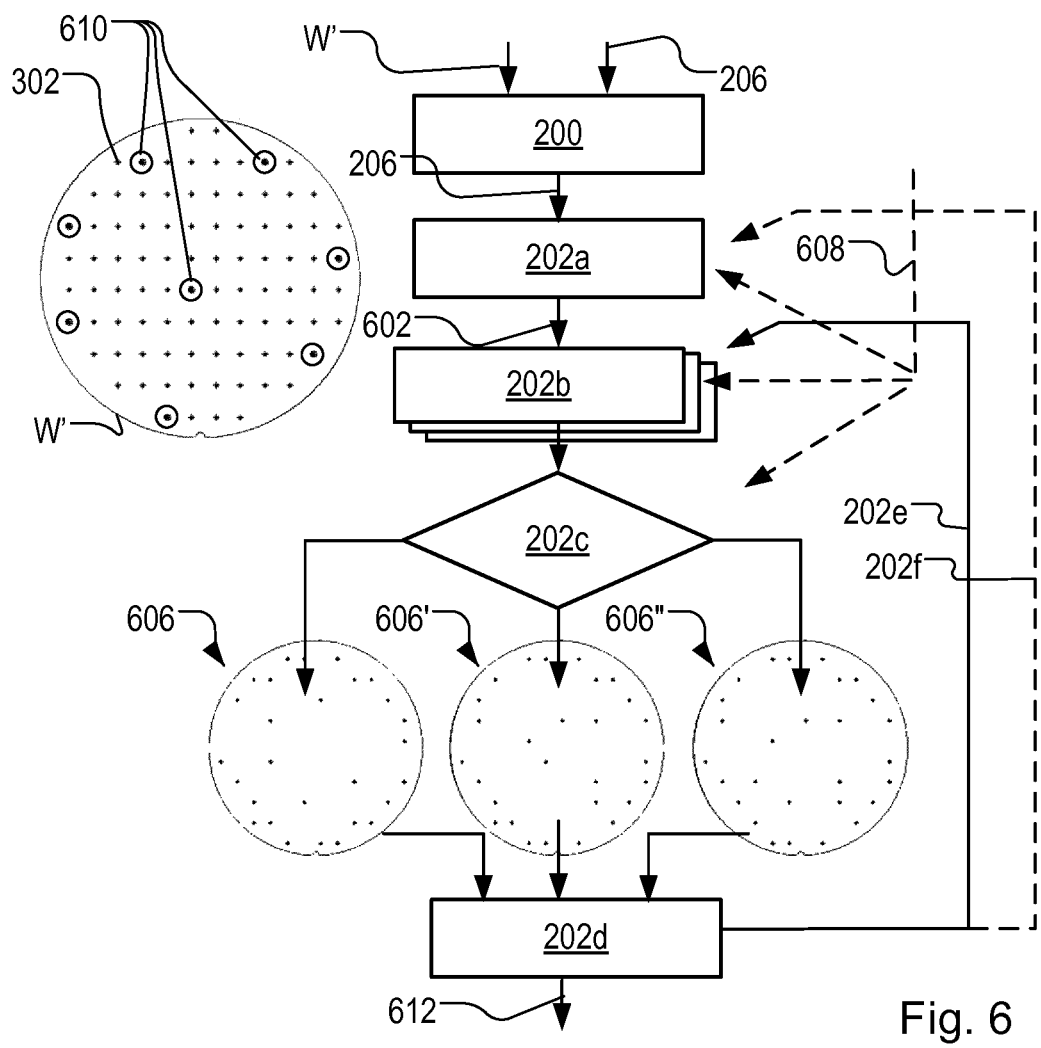
FIG. 6 illustrates a modified method for selecting a set of measurement locations dynamically for an individual substrate, according to a first embodiment of the present invention.

In FIG. 6, the functions of the alignment measuring step 202 and the dynamic selection function 600, as they relate to each substrate, are represented in the form of a flowchart. The method begins with step 200, where the new substrate W' and recipe data 206 are received. In response to the recipe data, at step 202a, a preliminary selection of measurement locations is made. At the left hand side in the Figure, the layout of substrate W' is shown, with all of the possible measurement locations 302 upon it. The preliminary selection of measurement locations 610 are indicated as eight circled points. The number eight, and the locations of the preliminary selection of measurement locations, are made to allow identification with as few measurements as possible, of a likely fingerprint present substrate. The measurements 602 from the preliminary selection are passed to an analysis step 202b. In the analysis step 202b, one or more analysis techniques and criteria are applied to the measurements obtained from the preliminary selection of measurement locations.

The results of this analysis are used at step 202c to determine some or all of the measurement locations to form the set of measurement locations selected for the substrate. In the illustration, the selection is made among three alternative sets. In the illustration, the three alternative sets or include the same measurement locations as the preliminary selection. This is not necessarily the case, but where measurement time and measurement results are precious, it would be undesirable to "waste" the measurements made in step 202a by not using them in further operations. Having determined some or all of the selected measurement locations, measurements are made of these locations in step 202d. Once measurements have been made for a complete set of measurement locations, the method passes to step 204, for example, as seen in FIG. 2. The measurements 612 from the full selected set of measurement locations are delivered as part of the measurement and recipe data 208, in the method of FIG. 2.

Depending on the implementation, the selected set of measurement locations may be determined iteratively, as shown by the return path at 202e. The analysis step 202b is then performed again using measurements obtained in step 202d, either alone or in combination with the measurements 602 obtained from the preliminary selection of measurement locations. At each iteration, the analysis in step 202b may be the same, or it may be different. At each iteration, the analysis in step 202b may apply a single set of criteria, or it may comprise multiple steps, performed sequentially or in parallel. After each analysis step, a further measurement subset of the selected set of measurement locations is determined and further measurements are made in step 202d.

In this way, the final dynamically selected set of measurement locations used can be assembled from one or more subsets, one or more of which subsets may include some or all of the preliminary selection of measurement locations. In a simple example, the set of measurement locations may comprise more than 20 locations, for example 28 locations, while the preliminary selection of measurement locations comprises fewer than 10 locations, for example 8 locations. Assuming that those eight are among the 28, then it will be appreciated that 20 of the selected measurement locations are selected dynamically, in response to measurements made the preliminary selection.

The preliminary selection of measurement locations (meaning the location and/or the number of points) can be for example defined by user based on common practice. Alternatively, the preliminary selection can be advised by the dynamic sampling software itself. It may be updated automatically with experience based on the full set of measurements, as illustrated by the optional step 202f in FIG. 6.

As mentioned, the preliminary selection of measurement locations may form a first subset of the selected set of measurement locations, while a second subset of the selected set of measurement locations is determined (at step 202c) in response to the measurements obtained using the first subset. Using the iterative approach, a third (and fourth etc.) subset of the selected set of measurement locations can be determined in response to measurements obtained using the first and second subsets of measurement locations. As illustrated in the example of FIG. 6, the dynamically selected set of measurement locations can include a subset selected dynamically from among a number of pre-defined subsets, 606, 606', 606". Alternatively, the selection can be assembled entirely dynamically, with no predefined distribution of measurement locations.

Figure 7:
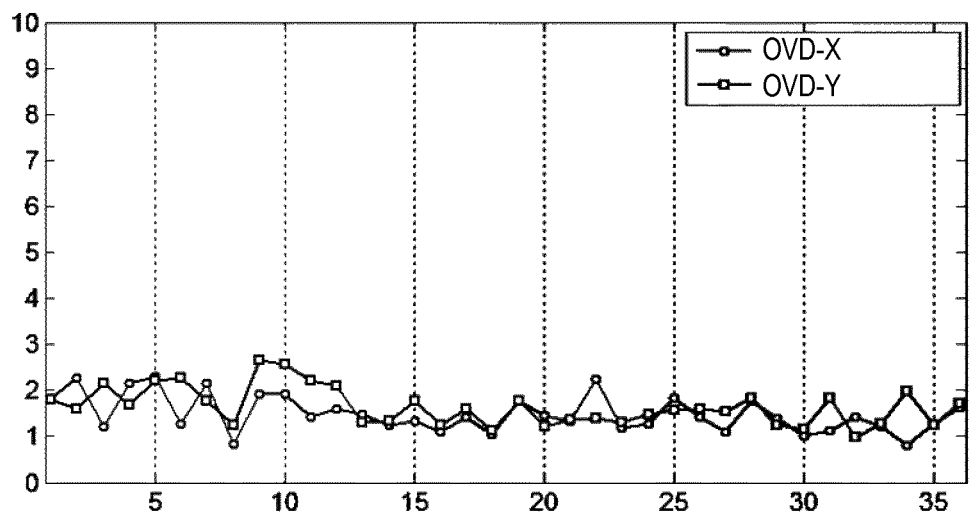
FIG. 7 illustrates deviation of performance parameters of the lithographic process, calculated to simulate the effect of selecting sets of measurement locations dynamically for each wafer over the same sample of wafers as FIG. 5.

Referring again to the example of FIG. 4, in some embodiments the dynamically selected subset of measurement location is selected at least partly by recognition of one or more predefined fingerprints. This may be, for example, to distinguish the fingerprint of substrate 400 from some other kind of fingerprint, or to distinguish the fingerprint of substrate 400 from a similar fingerprint with a different orientation. The analysis and selection at steps 202b and 202c is performed accordingly. Using the same sample set as in FIGS. 4 and 5, FIG. 7 shows the improvement in average overlay deviation OVD that is obtained by using only the same size of set of measurement locations, but selecting the set dynamically for each substrate, according to the observed fingerprint. For each of the 36 substrates, in other words, a preliminary selection 610 of eight measurement locations have been measured, and then additional measurement locations have been selected dynamically, to obtain a selected set of measurement locations that is one of the three options 606, 606' and 606". Each of these sets of measurement locations has only the same number 28 of measurement locations as the single set 306 used in the conventional example. However, because of the different distribution of measurement locations in each set, the distribution is better optimized to the fingerprint found on each wafer.

Comparing FIG. 7 with FIG. 5, it will be seen immediately that the overlay deviation attributable to the use of a finite set of measurement locations is much reduced, over the whole sample of 36 wafers. While the performance in FIG. 7 is no worse for those wafers numbers 13 to 17 which performed relatively well using the existing set, wafers 1 to 12, wafers 18 to 24, and wafers 26 to 36 all show significantly reduced overlay deviation in the Y direction, compared with what would be seen using a full set of measurement locations. To achieve this improvement, no additional measurement time has been taken per wafer. Of course the processing capacity has to be provided to perform the analysis step and the selection of further measurement locations based on the preliminary selection, without delay. Suitable processing can be implemented by programming of one or more processors within the lithographic apparatus control unit LACU. Alternatively, a dedicated processing could be added, if necessary.

Figure 8:
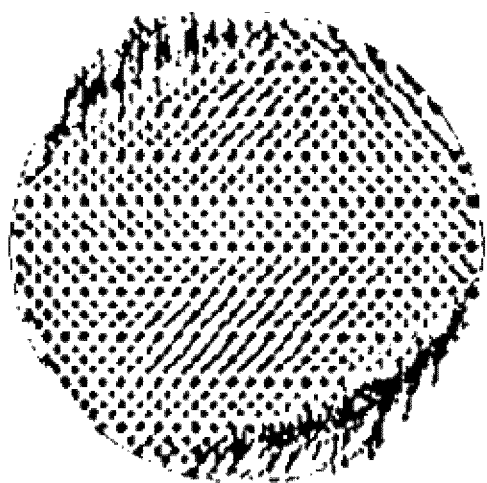
FIG. 8 illustrates the spatial distribution of deviation of performance (a) in the case of using the same selected measurement locations and (b) using the dynamically selected sets of measurement locations.
Figure 8:
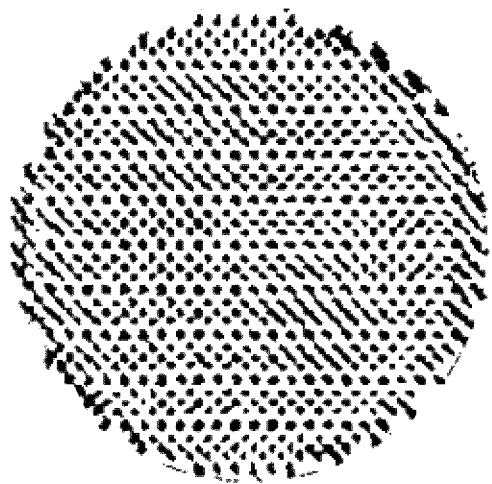

FIG. 8 is another representation of the results shown in FIGS. 5 and 7. In FIG. 8 (a), vectors show the overlay deviation in the X and Y directions at different locations across the substrate, when a single set of measurement locations is used, as in FIG. 5. Results over the full set of 36 wafers are stacked in this diagram. It can be seen that some extreme values of overlay deviation are concentrated in certain regions of the substrate, top left and bottom right in the drawing. In FIG. 8(b), on the other hand, we see the average over all the wafers in the sample of the overlay deviations when a dynamic selection is made from among the three sets of measurement locations 606, 606', 606". The extreme values of overlay deviation are no longer seen, and the overlay deviation values across the whole substrate are relatively uniform.

With regard to the example fingerprint of substrate 400, to determine which of the three alternative selections to make, the analysis step 202b may be performed so as to classify the fingerprint seen in the preliminary selection according to its swirl angle θ.

In another embodiment, the dynamically selected set of measurement locations may include at least one location selected by recognition of a statistically exceptional measurement at one of the selected measurement locations. Various criteria are known for recognizing "outliers" among the measurements made, also known sometimes as "flyers". Provided some room remains to add at least one additional measurement location to the selected set as it exists so far, one or more points can be added measurement locations can be added in response to the detection of an outlier. One form of response to the detection of an outlier might be, for example, to provide increase the density of measurement points in the vicinity of the outlier. The purpose of this would be to determine, using the full set of measurement locations, whether the "outlier" measurement is merely an anomalous measurement, or an indication of a physical anomaly on the substrate. As will be mentioned in relation to metrology applications, further below, measurement points "in the vicinity of the outlier" may be defined as points in the same vicinity on the substrate as a whole, or they may be defined by reference to an intra-field location, being in the vicinity of the outlier measurement point within a field, but at a field location somewhere else on the substrate.

The recognition of outliers may be performed with reference to the preliminary selection, and/or by reference to a larger set of measurement locations, when the method is performed iteratively. In one implementation, for example, after the preliminary selection has been made as a first subset of measurement locations, a second subset of measurement locations can be determined by recognition of the fingerprint, and then a third, probably smaller, subset of measurement locations can be determined by reference to outliers found in the first and/or second subsets.

In other embodiments, the dynamically selected set of measurement locations includes at least one location selected by recognition of a statistically exceptional distribution of measurements over a plurality of the selected measurement locations. As an example, the analysis step 202b may be performed so as to apply some statistical analysis to the results obtained from the preliminary selection of measurement locations. This analysis may be applied, for example, by reference to a model that is used as a performance indicator, and/or used as an alignment model or the like in the subsequent processing of the substrate. The density of measurement locations may be increased in regions where the obtained measurements deviate more than a certain threshold from the fitted model. The threshold can be defined in a number of ways, of course.

As already mentioned, one of the purposes of dynamic of the measurement locations is to increase the density of measurement locations at regions of the substrate where effects of interest are occurring. In particular, a higher density of measurement locations will be desired where process effects are causing a higher spatial frequency of variations among the measured data. Accordingly, in some embodiments of the analysis step 202b, a gradient may be calculated over the measurements already obtained. The selection step 202c can then be performed so as to increase the density of measurement locations in those regions of the substrate where the gradient observed over a plurality of the selected measurement locations. Depending whether the iterative method is being employed, the gradient may be observed over the preliminary selection of measurement locations, and or some larger subset of the selected measurement locations that has been determined in a previous iteration.

Referring back to FIG. 6, in any or all of the above embodiments, as an optional feature, the dynamically selected set may be selected based in part on the measurements of the preliminary selection of measurement locations 610, and in part on context information 608 received with the substrate. The context information can be applied also when determining the preliminary selection of locations, so that the preliminary selection need not be the same for every substrate. The context information can be applied in the analysis step, for example to determine or guide the analysis as to which types of fingerprints are to be expected. The context information can be applied in the selection and design step 202c. For example, the context information may indicate which of several thermal processing tools has been used in the prior processing of a particular substrate. By machine learning from past substrates, this knowledge may be obtained and used to predict the type of fingerprint, and/or the orientation and/or magnitude amplitude of the fingerprint.

Published patent application WO2015049087A1 describes various methods based on statistical analysis to recognize and predict the occurrence of different fingerprints in the presence of different context data. The fingerprints may be represented as principal components, for example, in an embodiment using principal component analysis (PCA). The results of such analysis can be used, for example, to receive information of fingerprints (principal components or the like) observed in the present substrates, and/or two receive information as to the presence of fingerprints that may be predicted on the basis of fingerprints observed in substrates having similar processing history in the past. As explained in the published patent application, measurements taken in the present method can be added to the database used in the statistical analysis, so that the machine learning process continues.

Metrology Apparatus Example

Referring again to FIG. 1, the dynamic selection of measurement locations from among a number of possible measurement locations can be applied in a metrology apparatus (inspection apparatus) such as the metrology apparatus 140 in the production facility shown in FIG. 1, the same as it can be applied to the measurement of alignment marks within the lithographic apparatus 100. In such an embodiment, the set of possible measurement locations may be defined by the presence of dedicated metrology target structures on the substrate. Examples are targets for overlay metrology, and also focus and dose metrology, linewidth (CD) and the like. Alignment sensors within the lithographic apparatus, and/or metrology tools within the lithographic apparatus or closely integrated with it can also be used to make measurements of parameters of performance, and not only to make position measurements in preparation for an imminent patterning step.

Using the example of overlay as a performance parameter, overlay targets can be provided at locations around and/or within product areas on the substrate. If the form of the target structures is necessarily different from the form of the alignment marks measured in the previous embodiment, then the location of the metrology target structures may be different. As mentioned already, sometimes of measurement may not require a dedicated metrology structure. They may be performed on product structures, or on blank areas. In that case, the structure being measured may be a simple layer or multilayer structure on the substrate, with no spatial variation in the plane of the substrate. Nevertheless, it is assumed for the purpose of the present disclosure that a set of possible measurement locations will be defined in some way. From this, a preliminary selection of measurement locations can be made. One or more further subsets of measurement locations can then be defined in response to the measurements made at the preliminary selection of measurement locations, building up dynamically a set of measurement locations for measurement of a substrate.

Thus, the methods of selecting a preliminary subset and a dynamically selected set of measurement locations that have been described above with reference to FIGS. 3 to 8 can be applied equally to the measurement of performance parameters after a lithographic process, as they were to the measurement of positional deviations in preparation for a lithographic patterning step.

Figure 9:
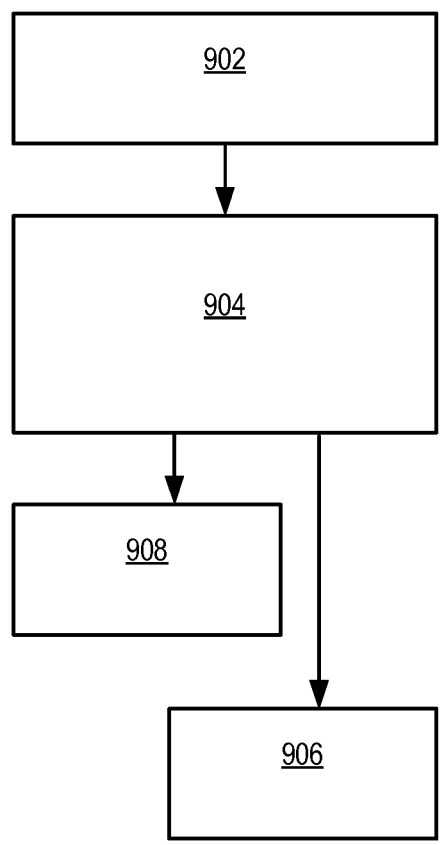
FIG. 9 illustrates a method of metrology and process control in a second embodiment of the present invention.

FIG. 9 is a flowchart of a method using the metrology apparatus 140 in the production facility of FIG. 1, with dynamic selection of measurement locations. At step 902, a substrate is processed through the lithographic apparatus and one or more other steps, until it is ready for measurement of the process parameter, for example overlay. At 904, the substrate is loaded into the metrology apparatus 140, which is equipped to measure the process parameter at a number of possible measurement locations across the substrate. As in the case of the alignment measurements described above, in a high-volume manufacturing environment, time does not permit a full set of measurement locations to be measured on every wafer, or even on a representative sample of wafers. Accordingly, a smaller set of measurement locations must be determined.

Within step 904, a method the same or similar to that described above with reference to FIG. 6 is applied to obtain measurements from a dynamically selected set of measurement locations across the substrate. Use of a dynamically selected set of measurement locations allows each set of measurements to capture the relevant features of each wafer more accurately, even in the presence of process variations from wafer to wafer. At step 906, in one example, the results of metrology of performance parameters on processed substrates are fed back through advanced process control and other mechanisms to improve the performance of subsequent processing of the same and/or other substrates. For example, lithography recipes and/or recipes for other processing steps may be updated, to achieve improved performance.

Alternatively and/or in addition, at step 908, recipes for metrology of future substrates may be updated. As before, any or all of these steps may be informed by context data and statistical analysis of historical performance data. As before, they dynamic selection of measurement locations may be based on the recognition of certain fingerprints, it may be based on recognition of outliers and/or other statistical exceptions.

In principle, the aim in both cases is to obtain more useful measurement information, without simply increasing the number of measurement locations. For metrology operations, the number of points measured per substrate may be fewer or, in practice, much greater than the number of points measured by the alignment sensors as part of the patterning operation. However, this naturally depends on the time taken per measurement, and also on whether measurements are to be made on every substrate, or only a representative sample. In a metrology environment where dense sampling is desired, it is common to measure several hundred points per wafer. Concerns to obtain evermore information in the presence of noise and varying process fingerprints all tend to increase the demand for denser metrology sampling. Applying the principles of dynamic selection which is the subject of the present disclosure, indiscriminate increasing of sampling density can be avoided, while ensuring that the measurements that are taken are better targeted at the properties of interest.

Given that the size of the selected set ultimately may be much larger than the set of measurement locations used in the alignment process described above, it may be expected that the preliminary selection of points should also be somewhat larger than the eight or 10 mentioned above.

As described above, certain fingerprints such as swirl patterns, circular and/or "crowning" effects can be recognized, and additional density of measurement locations provided in relevant regions of the substrate. These example fingerprints are examples of inter-field fingerprints, representing variation of parameters over he substrate In the metrology environment, measurements may also be made to capture intra-field fingerprints, not only inter-field fingerprints. In this case, statistically exceptional measurements made at a certain location in one or more fields can be recognized, and used to trigger additional measurements at corresponding locations in other fields. This is a variation on increasing the density of sampling in the vicinity of an "outlier" as described above. The skilled person will know how to adapt the teaching of the examples above to apply it in the context of intra-field variations.

Again, machine learning can be applied to assist the dynamic selection process, just as described with reference to FIG. 6.

In any of the embodiments, it may be expected, for example, that the preliminary selection of measurement points comprises less than half, optionally less than a third or less than a quarter of the number of measurement locations desired in the selected set of measurement locations. Where the total number of measurement locations to be selected is only in the range 20 to 40, then the number of measurements in the preliminary selection may be fewer than 15 or less than 10. Where the total number of measurements to be selected is in the range 200 to 400, on the other hand, the number of measurements in the preliminary selection may be fewer than hundred and 50, fewer than 100 or fewer than 50. As already mentioned, successive subsets of the final set of measurement locations may be determined iteratively, each based on a greater number of previous measurement locations, starting with the preliminary selection. In another example, where, for example, the only aim is to increase sampling density in the vicinity of "outliers", the majority of the set of measurement locations may be defined without reference to the current measurement data. Only a small subset, for example less than a quarter or less than an eighth of the total selected measurement locations might then be dynamically selected.

Outlier Detection and Removal

There will now be described problems and solutions relating to the detection of outliers (anomalous measurements) in the operation of a lithographic apparatus such as the one illustrated in FIGS. 1 and 2 above. The outlier detection and removal techniques disclosed herein form an independent aspect of the present disclosure, that may be used either in combination with the variable layout techniques described above, or in combination with other known or future layouts. The outlier detection and removal techniques will be described in the context of alignment measurements, but may be applied equally in the context of performance metrology, including in the metrology examples described above. In the lithographic apparatus, as already described above, wafer deformation is corrected by wafer alignment per wafer. The alignment sensor AS reads the wafer deformation (positional deviations) from the alignment marks for a given mark type and layout. For each alignment mark, deviation from the nominal position is obtained for x-, and y-directions, which represent the wafer deformation. This alignment data is then modelled by predefined alignment models like polynomials (for example up to $5^{th}$ order), or more advanced models.

Occasionally, outliers occur in the alignment data due to different reasons. When they are not correctly filtered, those outliers cause deterioration in overlay performance, due to the introduction of large false wafer correctable errors during the exposure. Especially, when high-order or advanced alignment models are used, the negative impact on overlay can be significant and results in deterioration in a large area on the wafer.

Figure 10:
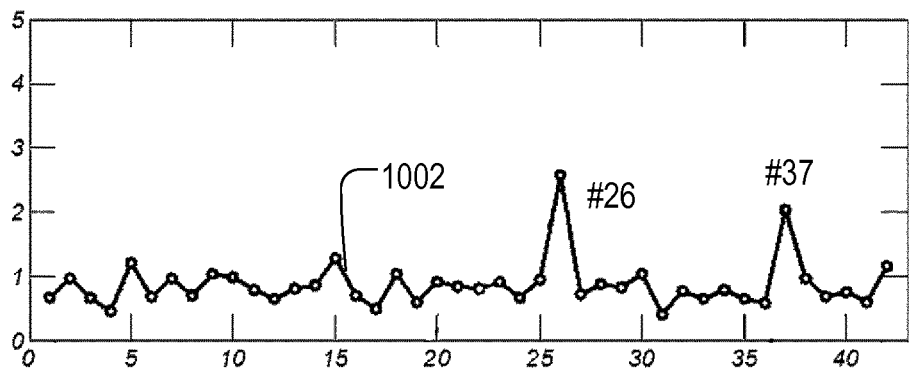
FIG. 10 illustrates the problem of outliers in measurement data, for example alignment data in a real example.
Figure 10:
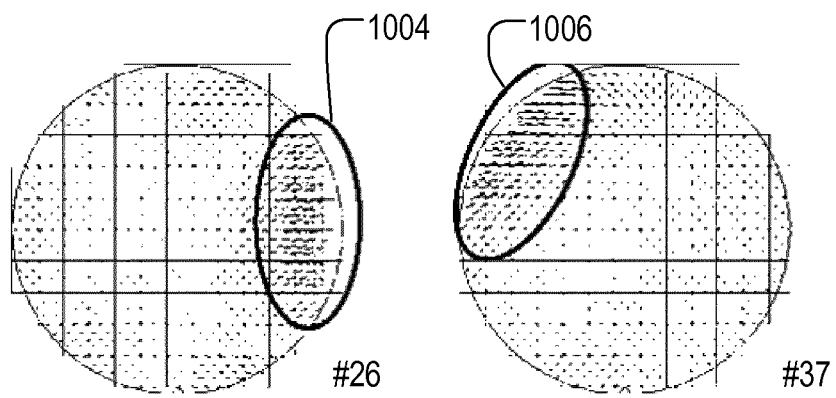
Figure 10:
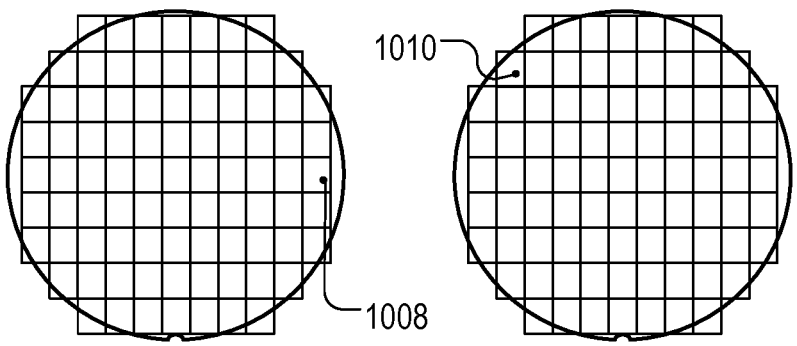

FIG. 10 illustrates problems caused by such outliers in two wafers within a series of 42 wafers measured in an example production situation. In FIG. 10 (*a*), wafer-to-wafer wafer correctable error variation is given as a trend plot 1002. The data for this illustration is taken from densely measured overlay data, after a pattern has been applied. The wafer ID number is represented along the horizontal axis. It is seen that wafers 26 and 37 have larger variation than the others. FIGS. 10 (b) and (c) show the distribution of overlay error across the wafer, for wafer 26 and 37, respectively. In these wafer fingerprints, in the highlighted regions 1004, 1006 larger overlay values are observed. In the Figures (d) and (e), it is found that these large regions of overlay error actually result from isolated instances of anomalous alignment measurements 1008, 1010. When these positions are compared with the map obtained by height sensor LS, it may be found that they correspond with so-called "hotspots", where the wafer surface is highly curved. A common causes of such hotspots is contamination on the back of the wafer, or on the substrate table WTa/WTb.

The affected regions seen in FIGS. 10 (b) and (c) are much larger in extent than the hotspots themselves, and it is desirable to remove outliers from the alignment data, to reduce the impact of hotspots on performance and yield. Although the outlier measurement may be a correct measurement of positional deviation at that location of the hotspot, it is not representative of the wafer deformation over a larger region, and it would be better to remove the outliers, before using them to control the positioning of a new pattern.

One current method for removing outliers is to define a threshold value to filter those outliers. If the residual value, for a given alignment model, is larger than the threshold for a mark on the wafer it will be judged an outlier and filtered out. This filtering out could involve completely disregarding the measured value, down-weighting it in the alignment model, or substituting an alternative value. However, particularly when the alignment model used is a higher order model specifically designed to capture higher frequency variations in wafer, it is found that not all the outliers are so obvious, and a simple threshold value cannot filter them out completely. The filter threshold cannot be reduced, without falsely identifying valid measurements as outliers and losing the desired benefit of the higher order alignment model.

Figure 11:
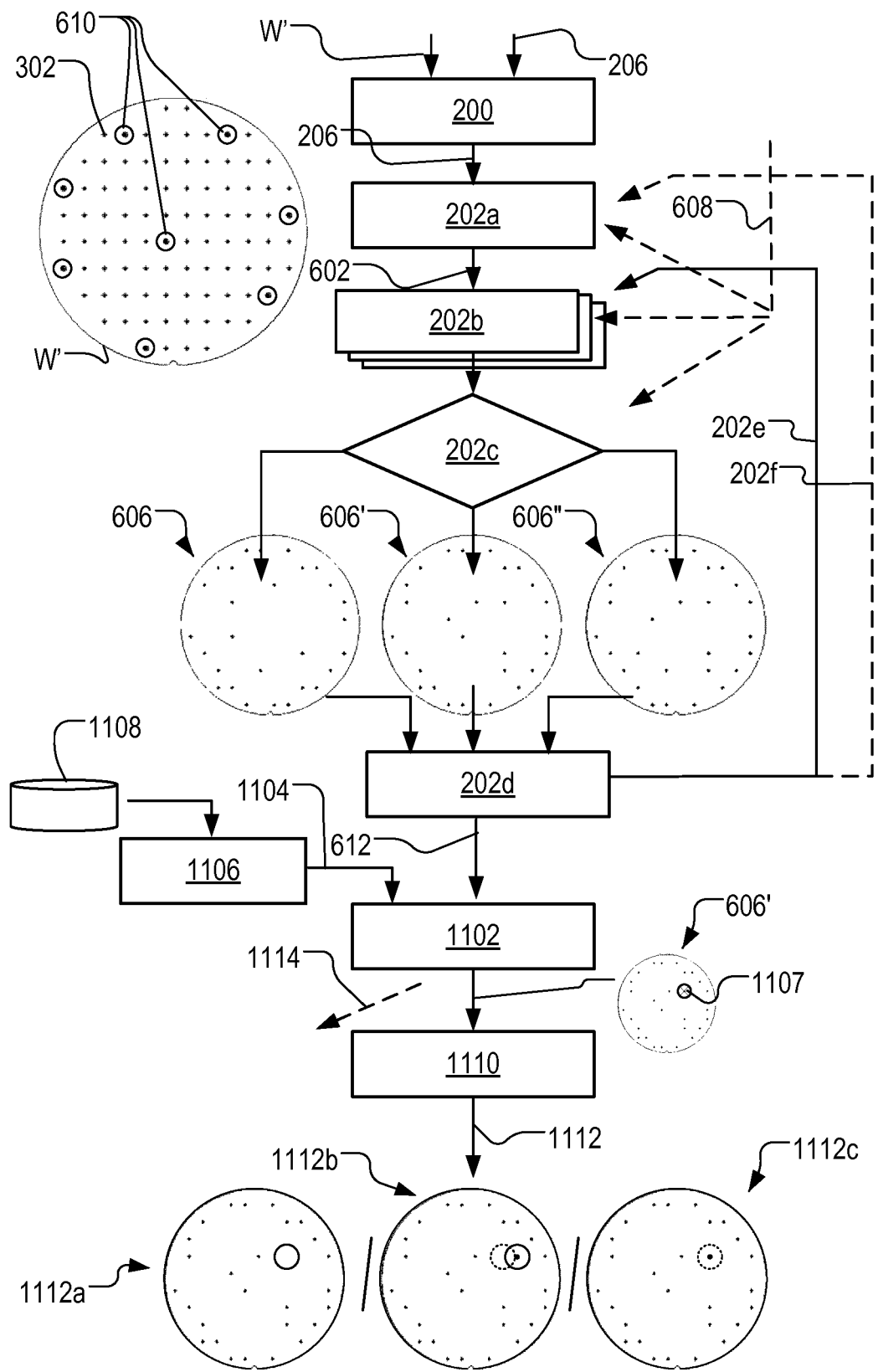
FIG. 11 illustrates techniques for detecting outliers and reducing their influence in accordance with various embodiments of the second aspect of the present disclosure.

Referring now to FIG. 11, some alternative methods are presented for the detection and optionally correction of outliers in the alignment data obtained for a given wafer. The methods will be presented in the context of the method of FIG. 6, already described above, but this is only as one example of the context in which this aspect of the disclosure may be applied. Further variants will be described below.

In the example of FIGS. 6 and 11, a set of measurements 612 are delivered, having been made at a set of measurement locations determined in step 202c. For example the set of measurement locations may have the layout indicated at 606', but it may be a fully dense layout or any other layout. Prior to using the set of measurements for alignment or for process control, however, a weighting step 1102 is performed, based on one or more quality tests. The quality tests are based on supplementary data 1104, rather than the current set of measurements alone. The supplementary data 1104 is delivered by an analysis step 1106. The quality test may identify one or more of the measurements or measurement locations as an outlier, for example the measurement labelled 1007. A zero weighting, or some lower weighting is then implied.

In some examples below, the analysis step 1106 is performed using historical data 1108 comprising measurements of the same type as the current measurement, but made on previously processed wafers. In other examples, the analysis step 1106 is based on another type of measurement made on the current wafer, for example on height data obtained from height sensor LS. In such examples, the analysis step and quality test can in principle be performed before making the measurements in step 202d, if the height data is available. The height data may be available for example in embodiments where the sequence of measurements by the different sensors AS, LS may be different to that illustrated in FIG. 3. The height data may be available for example in embodiments where the sequence of alignment measurements and height measurements includes separate coarse and fine measurement steps, rather than the simple sequence illustrated in FIG. 3.

At step 1110 there is output a modified set of measurements 1112, in which the weighting determined by the quality test is used to suppress completely or partially the measurement made at the outlier location 1107. In a case where the measurements have not been made or not completely made yet, a modified set of measurement locations may be output, rather than a modified set of measurements. Three examples of different types of modified sets of measurement are illustrated at 1112a to 1112c in FIG. 11.

At 1112a there is illustrated the simple case of deleting or ignoring a measurement at the identified outlier location 1107. In the terminology of the introduction and claims, deleting or ignoring a measurement or a measurement location is one implementation of a zero weighting. Depending on the implementation, it may be preferred to retain the measurement but multiply it by zero, or it may be preferred to delete it or to ignore it by some logical step.

At 1112b there is illustrated an alternative method of responding to the detection of an outlier, that of substituting a measurement obtained at a neighboring location. Where the measurements 612 have already been made according to the partial layout 606', adding a further measurement may or may not be time-consuming, depending on the particular implementation.

At 1112c there is illustrated a further alternative method of responding to the detection of the outlier 1107. Here, a calculated or estimated value of the measurement is substituted for the actual measurement, based on the analysis and the supplementary data 1104. Examples of this will be described below.

If the number of outliers detected in step 1102 is too great, a step 1114 may be performed to reject the wafer.

As mentioned already, different types of supplementary data and analysis may be applied to implement the principles of the method of FIG. 11. In one example, outliers are identified using historic data 1108 comprising alignment data, and statistical analysis 1106 as to the historic wafer-to-wafer variation per measurement location. If a new measurement has large variation outside the historically expected range, it needs to be excluded (zero weighted) or down-weighted.

In an example, vector maps of wafer alignment (6par residual) and its wafer-to-wafer variation per point are calculated, based on residuals of the alignment measurements after a six-parameter (6PAR) fit. It is found that true outliers can be detected more successfully when a threshold is set for wafer-to-wafer variation instead of only the values for the current wafer. In particular, the disclosed method avoids labelling as outliers measurements that happen to have a high residual value, where the high residual value is actually expected based on historical data. Furthermore, the method can now detect outliers that have a relatively low residual value, where a high residual value would be expected based on historic data. The conventional method based only on residuals for the current wafer would not detect these measurements as outliers at all.

In another example based on historic measurement data, outliers are detected using propose to detect outliers using multivariate analysis as a type of statistical analysis step 1106. Principle Component Analysis (PCA) is a statistical tool to decompose a data set into major components, and it can be successfully applied to alignment data. The principles and application of PCA to measurements of alignment, overlay and the like are described in published patent application WO2015049087A1 (Ypma et al), the contents of which are incorporated herein by reference. The spatial distribution of measurement values across the wafer is decomposed into a set of component vectors, referred to as the principal components (or "Eigen wafers") of the observed data. In the published patent application, PCA is used to facilitate analysis of the causes and effects of different errors in the lithographic manufacturing process. When a data set is decomposed to its principal components, the importance of each component can be calculated.

Figure 12:
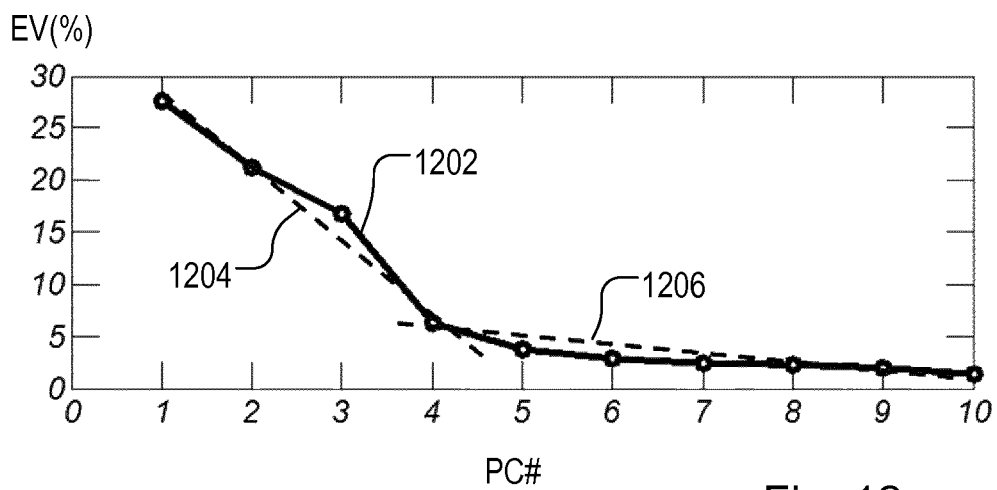
FIG. 12 illustrates a principle of statistical analysis according to an example outlier detection method based on principal component analysis.

FIG. 12 illustrates the importance of principal components calculated for the example production data illustrated in FIG. 10. Principal component number PC# is indicated along the horizontal axis, while the "explained variance" EV is plotted on the vertical axis. A curve 1202 illustrates how the first principal components are dominant for explaining what is observed in the alignment data, with importance decreasing along a slope 1204. There is a much more gradual slope 1206 after component 4, and an elbow point can be determined for this curve to determine the most important components. In summary, the first few components are the most important ones and sufficient to describe majority of the observed data. The remaining components can be seen as noise.

Figure 13:
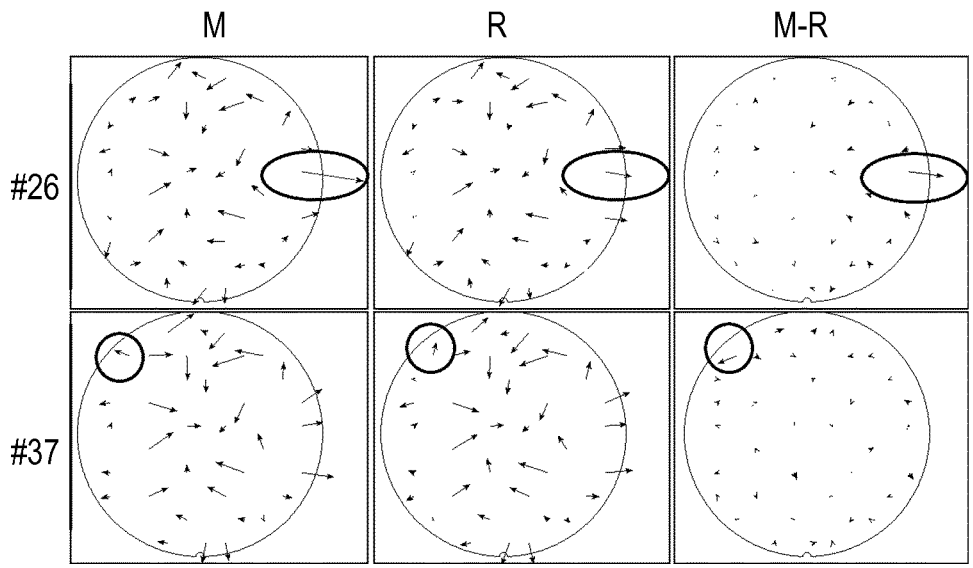
FIG. 13 illustrates detection of outliers using the principle of FIG. 12 in the example of FIG. 10.

Referring to FIG. 13, and considering then that outliers will not be captured in first few principal components, the present example reconstructs the original data using only the major components. As a result, the outliers can be detected by a quality test in step 1102. In FIG. 13, for the "problem" wafers #26 and #37, plots M show the alignment measurements actually obtained. These measurements are in fact residuals after subtracting an alignment model fitted to the actual measured values, for example residuals from a 6PAR model. The skilled reader will fully appreciate that it is a matter of design choice for each application and each type of measurement, whether the outliers are detected by reference to measured values, or residuals or other processed version of the measured values. Plots R show the data reconstructed using only the first 5 components after PCA analysis, based on historical data 1104. Plots M-R show the difference (delta) obtained when the measured values are compared with the reconstructed values. For most measurements, the delta is close to zero, and the outliers are clearly visible, as highlighted.

Weighting the alignment data based on the delta, the modified measurement data can be produced in various ways, as already mentioned. As a simple example, the step 1110 may simply exclude any measured alignment mark when delta per point is larger than a pre-defined threshold (result 1112*a*). Optionally a measurement from a neighboring point could be used instead (result 1112*b*). Alternatively, when delta (M-R) for a point is larger than a pre-defined threshold the step 1110 may replace the outlier measurement (in plot M) with an estimate based on the reconstructed data (in plot R) (result 1112*c*).

The definition of outliers is very flexible. The described technique can also be applied for data smoothing. By removing higher numbered components, smoothing and filtering can be achieved.

In another example, supplementary data is not based on historical measurements on previous wafers, but on different measurements on the current wafer. A particular measurement of interest for detecting hotspots is the wafer height data obtained by height sensor LS as part of the measurement process prior to exposure (FIG. 3). Analysis step 1106 processes the height data to identify "hotspots", that is areas of local unflatness.

In the example of FIG. 10, when a map of wafer flatness is examined, there are hot spots observed in the wafers #26 and #37. Alignment measurements at locations corresponding to these hot spots in wafer flatness data may be flagged as suspect in the quality test step 1102. The size of these suspicious alignment vectors was below the normal outlier threshold value, so that they were not excluded from the alignment model, leading to the large regions of impaired performance shown in FIGS. 10 (*b*) and (*c*). When the size of those marks are compared only to other marks in the same wafer, they are not obviously outliers; especially in wafer 37 it is even smaller than many other marks. Using height data as supplementary data in a quality test allows these suspect marks to be identified as outliers nevertheless.

As in the previous example, the modified measurement data can be produced in various ways. As a simple example, the step 1110 may simply exclude any measured alignment mark associated with an identified hotspot (result 1112*a*). Optionally a measurement from a neighboring point could be used instead (result 1112*b*). If further data, such as historic data with PCA analysis is available, an estimated value could be substituted (result 1112*c*).

Figure 14:
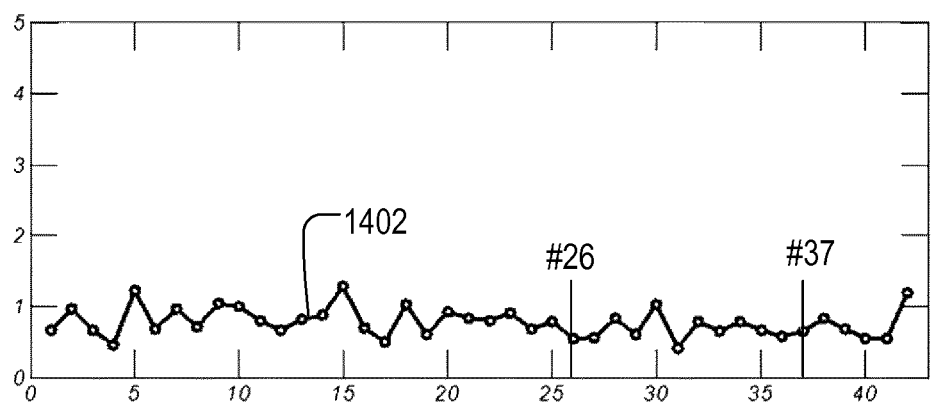
FIG. 14 illustrates improved overlay performance on problem wafers, compared with the example of FIG. 10(a)

In FIG. 14, wafer-to-wafer variation of overlay is simulated after using the above methods to exclude the indicated outliers in wafers #26 and #37. The updated trend plot 1402 can be compared to trend in FIG. 10 (*a*). This demonstrates well that excursions in the performance can be avoided if the alignment outliers are successfully removed. (Note that for FIG. 14 we simulated the effect of outlier removal only for wafers 26 and 37. The other wafers may have also potential to improve, not shown in FIG. 14).

Alternative Examples

In the above description of example embodiments, it is assumed that the property measured at the preliminary selection of measurement locations and the property measured at the dynamically selected set of measurement locations are the same property, and the same type of measurement is made in both steps. In that case, the preliminary set of measurement locations can be a first subset of the set of measurement locations used to deliver a set of measurements. Alternative embodiments are possible, however, in which the measurements made at the preliminary selection of locations have one character, and are performed using one type of measurement method and apparatus, while the dynamically selected set of measurement locations is used to measure a different property with a different measurement apparatus or method.

As an example, in one such embodiment, a preliminary set of alignment measurements could be used to determine a dynamic selection of locations for metrology of a different kind. Measurements made at a preliminary selection of locations could be made by a camera of some kind, and used to determine dynamically a selection of locations for measurement of alignment marks, or measurement of performance parameters such as CD or overlay. Height measurements made at a preliminary selection of measurement locations, for example, could be used to determine dynamically a set of measurement locations for measurement of alignment, CD or overlay. For example, height measurements made at a preliminary selection of locations may be used to identify regions where a higher density of alignment measurements should be taken, or vice versa. Measurements of one or more properties made at a preliminary selection of locations with one sensing recipe (specifying a particular combination of wavelength(s), polarization(s) etc.) could be used to determine dynamically a set of measurement locations for measurement of alignment or height using a different recipe. The same principle can be extended to measurement of different properties in a metrology method.

In the case where the type of measurement made at the preliminary subset of locations is different than the type of measurement made at the selected set of locations, it will be understood that different types of target structure may be involved in the different types of measurement. For measurements such as alignment or overlay, a specific target structure might be provided. For measurements such as wafer height, a height sensor may operate without requiring a specific target structure to be provided. the phrase "target structure" in any case encompasses a surface or layer structure, as well as a product structure, or dedicated alignment mark or metrology target.

Two examples will now be described, with reference to FIGS. 15 to 17. These are both examples of the case where height measurements made at a preliminary selection of locations may be used to identify regions where a higher density of alignment measurements should be taken. In lithography, a wafer height profile is captured that is different for each wafer. The height variations affect the aligned position, but currently they are not taken into account when the alignment strategy is defined by the customer. As described already, the alignment strategy is typically the same for all wafers. Consequently a part of the wafer-to-wafer overlay variation that is due to variations in the height profile of the wafers is not well corrected by the alignment system.

Figure 15:
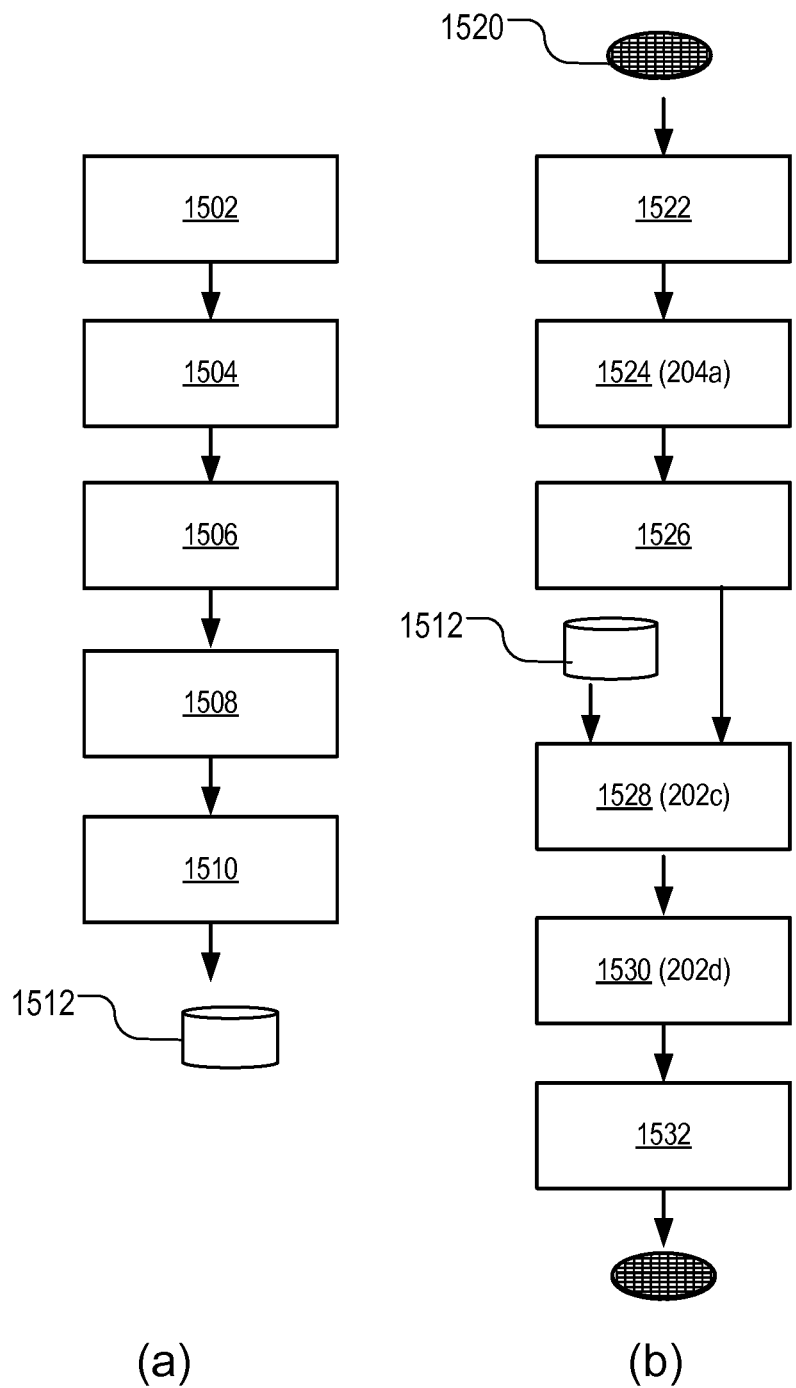
FIG. 15 illustrates a method of metrology and control in a third embodiment of the present invention, the method comprising (a) an offline process and (b) an inline process.
Figure 16:
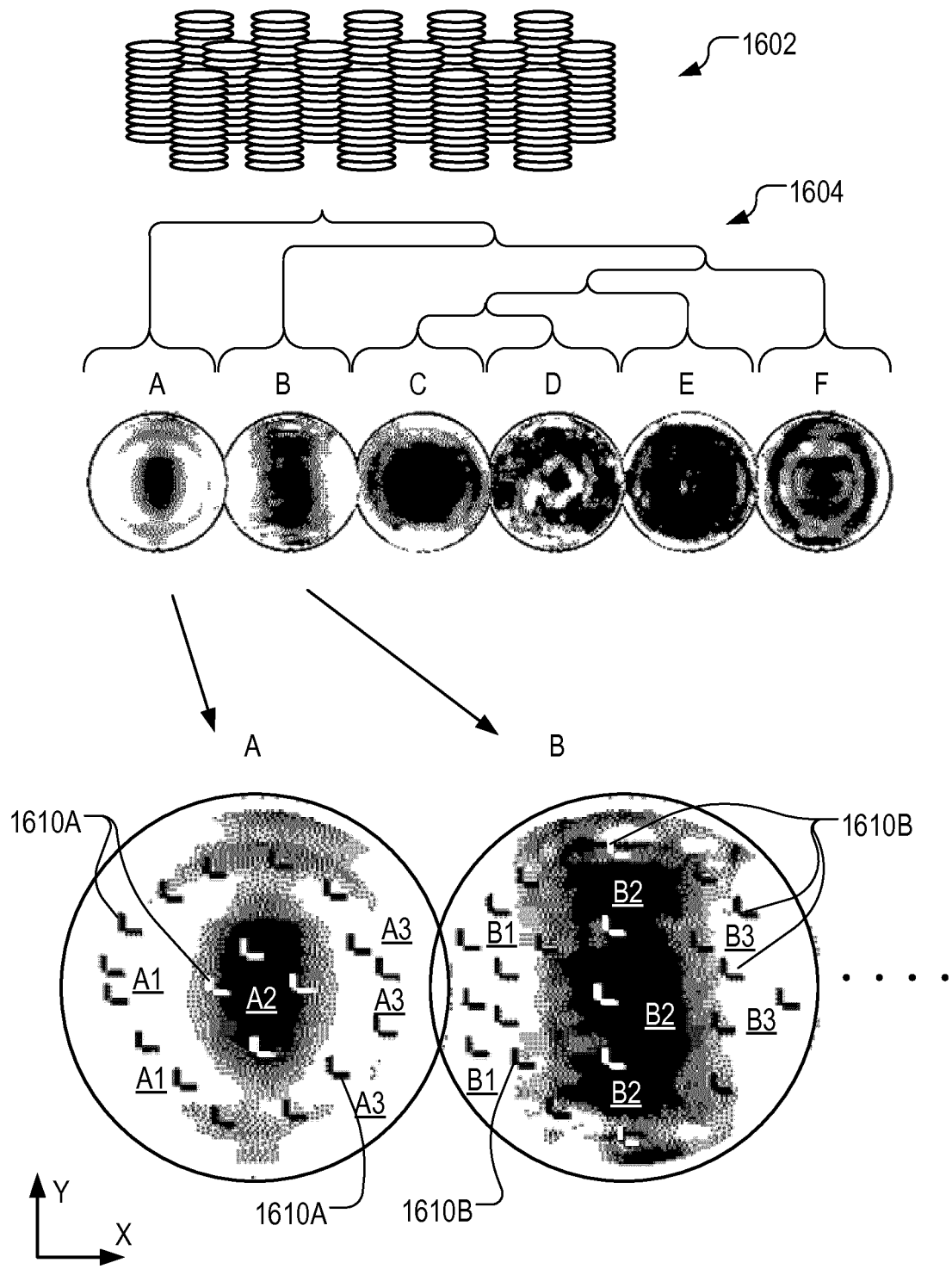
FIG. 16 illustrates height gradient maps and dynamic selection of measurement locations in the method of FIG. 15.
Figure 17:
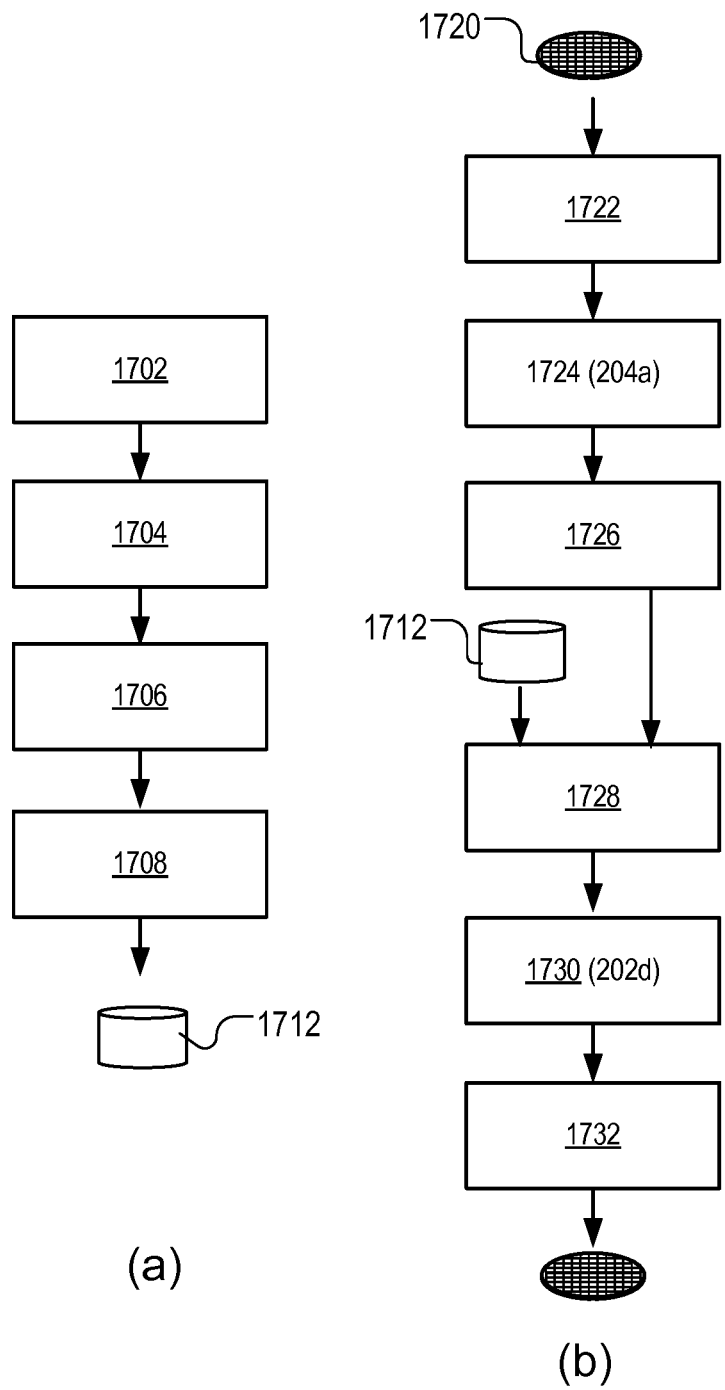
FIG. 17 illustrates a method of metrology and control in a fourth embodiment of the present invention, the method comprising (a) an offline process and (b) an inline process.

In the methods of FIGS. 15-17, a measured wafer height profile is used to optimize the alignment strategy for each individual wafer. Two methods are proposed to use the height profile: (FIGS. 15 and 16) a method that assigns the locations of alignment marks based on predetermined groups that define "typical" wafer height profiles and (FIG. 17) a method which assigns the locations of alignment marks based on predetermined "rules" or strategies, using the height information of the wafer profile. In the examples, gradient information is derived from the height profile and used to select the alignment recipe. In both methods an "offline" process determines the rules or the groups based on historic data. An "inline" process then uses this information to optimize the alignment strategy for each new wafer.

FIG. 15 (a) is a flowchart of the offline process. The steps are as follows. In step 1502 height data for a population of wafers is gathered. In step 1504 the height data is converted to gradient data. In step 1506 the population is divided into groups based on certain characteristic patterns being observed in the gradient data. Hierarchical clustering techniques are well known, that can be applied to perform this clustering. Analysis of datasets from a UV height sensor is presented in the paper by Schmitt-Weaver et al, "Computational overlay metrology with adaptive data analytics", Paper 10145-31, presented at SPIE Advanced Lithography 2017, San Jose, Calif., United States, 26 Feb.-2 Mar. 2017.

FIG. 16 shows characteristic gradient distributions for six sub-populations or groups, identified in a population 1602 of processed wafers by a hierarchical clustering process 1604. The six groups have characteristic distributions of gradient, and are labeled A to F. In each plot, darker shading indicates areas with lower gradient (flat areas), while lighter shading indicates areas with higher gradients. In the lower part of FIG. 16, the distributions for group A and group B are shown enlarged, by way of example. In practice of course one would plot in color and these black and white versions are shown only for compatibility with patent rules. The full color plots are shown in the SPIE 2017 paper mentioned above. Gradients in the X and Y directions can be treated separately, if desired, but the plots show the magnitude of the gradient vector in X and Y together. Regions A1, A2, A3 and B1, B2 and B3 are labeled on the respective plots.

In step 1508, for each group, an alignment strategy is determined, including a particular distribution of measurement locations. Regions where there is little variation (i.e. the dark areas) do not need dense alignment mark sampling whereas regions with rapid change (gradient) will benefit from more dense alignment sampling. For the first two groups, an optimized set of measurement locations 1610A are shown overlaid on the group A distribution, and optimized measurement locations 1610B are shown overlaid on the group B distribution. In the example, regions A1 and A3 in the distribution of group A are regions with relatively high gradients in the measured height map, while region A2 has relatively low gradients. Consequently the optimized set of measurement locations has a greater density of measurement locations in the regions A1 and A3. Similarly, regions B1 and B3 in the distribution of group B are regions with relatively high gradients in the measured height map, while region B2 has relatively low gradients. Not visible in the black and white version of the plot, the gradient is higher in region B1 than in region B3. Accordingly, the optimized set of measurement locations has a greater density of measurement locations is greatest in region B1, and the density of measurement locations is lowest of all in the region B2.

It will be understood that the term "optimized" in this context does not imply any absolute idea of "best" or "optimum" set of locations. In reality, a true "optimum" set of locations is unachievable, because would be specific to each individual wafer, and would depend also on which parameters of performance are to be maximized. An "optimized" set of measurement locations therefore should be understood as referring to any set of measurement locations that is adapted to a wafer or group of wafers, and is intended to improve one or more parameters of performance of the lithographic process, compared with what could be achieved using a generic set of measurement locations for all wafers.

In summary, in this example method we use some or all of the height data from many wafers of many lots to determine the characteristic groups. For example, analysis of many wafers from a particular manufacturing facility revealed that there are six characteristic groups, as illustrated in FIG. 16. Suitable software will distribute the measurement location marks in the appropriate regions and define the appropriate alignment model/color/orders. Finally in step 1510, the optimized alignment strategies associated with each group are stored in a database 1512. Also stored are the characteristic patterns (gradient maps) associated with each group. The database may be for example stored within the control unit LACU of the litho tool 100, for quick retrieval by the inline process.

FIG. 15(b) illustrates the inline process which uses the results of the offline process to select optimized alignment strategies for each wafer 1520 to be processed. At 1522 a new wafer 1520 is loaded into the litho tool 100, measurement station MEA. Referring also by analogy to the examples of FIGS. 2 and 6, it was mentioned that the measurement steps 202 and 204 for alignment and height may be performed in either order, and each step 202, 204 may be divided into coarse and fine parts. For the present example, it is assumed that at least a coarse height measurement step (call it 204a) is performed before the fine alignment measurements for the full set of measurement locations (step 202d). Thus in step 1524 (204a) height values are measured at least coarsely across the substrate. At step 1526 a height gradient map is calculated similar to the ones shown in FIG. 16.

At step 1528 (202c), using the data from database 1512 that was stored by the offline process, the inline process identifies which group best matches the gradient map measured for the current wafer, and retrieves the parameters defining the optimized alignment strategy for the identified group. At step 1530 (202d) the alignment measurements are made using the optimized set of measurement locations. Further measurements such as a fine height map can of course also be made. The exposure (patterning) step is performed at 1532 using the results of the alignment measurements and other measurements. Also step 1524 is not limited to height measurements, and coarse alignment measurements could be made also.

FIG. 17 illustrates another method, again comprising an offline process (a) and an inline process (b). The principle is again to select measurement locations for alignment based on preliminary measurements of heights and gradients, but the implementation is different. FIG. 17 (a) is a flowchart of the offline process in this second method based on heights and gradients. The purpose of the offline process is to determine the "rules" or strategies for alignment mark location assignment based on the density of the gradients. For example in a flat area of the wafer the gradients are the same over a large area. In regions with widely varying height profiles, the gradients will vary more. Thus the choice of measurement locations is a function of the density of the gradients. These strategies are stored in the litho tool control unit LACU for quick retrieval by the inline software.

The steps of the offline process in this example are as follows. In step 1702 height data for a population of wafers is gathered. In step 1704 the height data is converted to gradient data. In step 1706, rather than divide the population of wafers into groups, the offline process simply determines one or more "rules" or strategies for measurement location selection, based on the magnitudes of the gradients. For example in a flat area of the wafer the gradient will have relatively low magnitude over a large area. In regions with widely varying height profiles, the gradients will have greater magnitude.

In step 1710, the rules or strategies for determining optimized alignment strategies are stored in a database 1712. The database may be for example stored within the control unit LACU of the litho tool 100, for quick retrieval by the inline process.

FIG. 17(b) illustrates the inline process which uses the results of the offline process to select optimized alignment strategies for each wafer 1720 to be processed. At 1722 a new wafer 1720 is loaded into the litho tool 100, measurement station MEA. Referring again by analogy to the examples of FIGS. 2 and 6, it is assumed that at least a coarse height measurement step (call it 204a) is performed before the fine alignment measurements for the full set of measurement locations (step 202d). Thus in step 1724 (204a) height values are measured at least coarsely across the substrate. At step 1726 a height gradient map is calculated, which may resemble one of the characteristic plots shown in FIG. 16, or may be different from any seen before.

At step 1728, using the rules that were stored in database 1712 by the offline process, the inline process generates an optimized alignment strategy, including an optimized set of measurement locations adapted to the particular gradient map of the current wafer 1720. At step 1730 (202d) the alignment measurements are made using the optimized set of measurement locations. Further measurements such as a fine height map can of course also be made. The exposure (patterning) step is performed at 1732 using the results of the alignment measurements and other measurements. Also step 1524 is not limited to height measurements, and coarse alignment measurements could be made also.

In summary, the inline process distributes the measurement locations using the "rules". The strategy may use one or more key performance indicators (KPIs). An example KPI might be to achieve best fit of a small piece of gradient area to the reference sets stored on the scanner to distribute the marks. The advantage of this method, as compared to the group based method, is that it is entirely automatic; no setup to identify groups is required.

Summarizing the alternative examples of FIGS. 15 to 17, a common feature is the use of the height maps to influence the sampling of alignment marks. That is to say, while alignment marks are used to measure in-plane positional deviations (X and Y) over a substrate, the dynamic selection of measurement locations for alignment can be based on measurements of height (Z position) at a set of preliminary locations. The preliminary locations can be sample points of a coarse height mapping process, or a fine height mapping process. There is not necessarily a one-to-one correspondence between measurement locations for height and measurement locations for alignment. Two example methods are presented, while many variants can be envisaged by the person skilled in the art. As in the earlier examples, the alignment strategy is now defined per wafer instead of being the same for each wafer in the lot. Using an alignment strategy optimized for each individual wafer will reduce the wafer-to-wafer overlay variation. This will have the added benefit of more precise feedback control in the overall manufacturing system, since the sampled wafers for calculating the feedback correction parameters are more alike. Alternatively, another benefit could be realized, that fewer wafers would need to be sampled for calculating the feedback correction parameters, to achieve the same performance. For example, it may be that three wafers per lot need to be sampled to provide good enough feedback control, where previously it required four.

As a bonus, the gradient measure by the height sensor can be used to interpret the measured positions of alignment marks in a more accurate manner. Suppose that mark asymmetry is detected as part of the measurement procedure. Knowing the local gradient can allow the lithographic apparatus to distinguish between cases in which the observed asymmetry of an alignment mark is caused by physical and/or chemical processing steps in the lithographic process, and cases in which the asymmetry appears because the mark is positioned on a steeply sloping part of the substrate. Such a case may be caused for example by local contamination and may cause a physical distortion of the mark as seen by the alignment sensor.

Further embodiments of the inventions are disclosed by the numbered clauses:

1. A method of obtaining measurements from locations across a substrate before or after performing a lithographic process step, wherein a set of measurement locations is selected from among all possible measurement locations, and at each selected location a measurement is made of a property of a structure on the substrate, wherein at least a subset of the selected measurement locations is selected dynamically, in response to measurements obtained using a preliminary selection of measurement locations.

2. A method according to clause 1, wherein the preliminary selection of measurement locations includes a first subset of the selected set of measurement locations, a second subset of the selected set of measurement locations being selected dynamically in response to the measurements obtained using the preliminary selection.

3. A method according to clause 2 wherein a third subset of the selected set of measurement locations is determined in response to measurements obtained using the first and second subsets of measurement locations.

4. A method according to any preceding clause wherein the number of measurement locations in the preliminary selection comprises fewer than one half of the number of measurement locations in the selected set, optionally fewer than one quarter.

5. A method according to any preceding clause wherein the dynamically selected subset of measurement locations comprises fewer than one half of the selected set of measurement locations, optionally fewer than one quarter.

6. A method according to any preceding clause wherein the dynamically selected set of measurement locations includes at least a subset selected from a number of pre-defined subsets.

7. A method according to any preceding clause wherein the dynamically selected subset of measurement locations is selected at least partly by recognition of one or more predefined fingerprints.

8. A method according to any preceding clause wherein the dynamically selected subset of measurement locations includes at least one location selected by recognition of a statistically exceptional measurement at one of the selected measurement locations.

9. A method according to any preceding clause wherein the dynamically selected subset of measurement locations includes at least one location selected by recognition of a statistically exceptional distribution of measurements over a plurality of the selected measurement locations.

10. A method according to any preceding clause wherein the dynamically selected subset of measurement locations is determined at least partially in response to a gradient observed over a plurality of the selected measurement locations.

11. A method according to any preceding clause wherein the dynamically selected subset is selected based in part on the measurements of the preliminary selection and in part on context information received with the substrate.

12. A method according to any preceding clause wherein a plurality of substrates are processed, the selection of the set of measurement locations being made for each substrate individually.

13. A method according to clause 12 wherein the preliminary selection of measurement locations is the same for each of the substrates.

14. A method according to any preceding clause further comprising a step of applying a quality test to the measurements, and applying a zero or reduced weighting to one or more measurements identified as outliers based on a result of said quality test.

15. A method according to clause 14 wherein the quality test is based on a comparison of the measurements with statistical data based on previously processed substrates.

16. A method according to clause 15 wherein said statistical data represents a variation of measurements across the previously processed substrates, and the quality test is based on a comparison of a current measurement with the range of variation seen at corresponding locations on the previous substrates.

17. A method according to clause 16 wherein the variation is determined using residual values relative to a fitted model.

18. A method according to clause 15 wherein said statistical data represents a set of component vectors describing spatial distributions of measurements over the previous substrates.

19. A method according to clause 18 wherein the quality test compares a measurement with a value predicted by one or more of the component vectors.

20. A method according to any of clauses 15 to 19 wherein the outlier measurement is replaced with a value based at least partly on the statistical data.

21. A method according to any of clauses 14 to 20 wherein the quality test is based at least partly on height data measured on the substrate.

22. A method according to any of clauses 14 to 21 wherein a zero weighting is applied to outlier measurement.

23. A method according to any of clauses 14 to 22 wherein the outlier measurement is replaced with a measurement made at a neighboring position.

24. A method according to any preceding clause wherein the measurements are position measurements made after loading a substrate into a lithographic apparatus, the method further comprising applying a pattern to the substrate using the position measurements.

25. A method according to clause 24 wherein measurement locations of in-plane positional deviations are selected dynamically, in response to height measurements obtained using said preliminary selection of measurement locations.

26. A method according to clause 25 wherein measurement locations of in-plane positional deviations are selected dynamically, in response to gradients observed in the height measurements.

27. A method according to any of clauses 1 to 26 wherein the measurements are measurements of a performance parameter performed on the substrate after a lithographic process step.

28. A method according to clause 27 further comprising controlling a subsequent lithographic process step based at least partly on the measurements of said performance parameter.

29. A method according to clause 27 or 28 further comprising controlling a subsequent metrology step based at least partly on the measurements of said performance parameter.

30. A method according to any of clauses 27 to 29 wherein the measurements are measurements of overlay as a performance parameter.

31. An apparatus for performing a process step in a lithographic process, the apparatus including a measurement system for making measurement of a substrate prior to performing said process step, the measurement system being arranged to obtain measurements at a selected set of locations across the substrate using a method according to any of clauses 1 to 30.

32. An apparatus according to clause 29 wherein said process step is a step of applying a pattern to the substrate.

33. An apparatus according to clause 32 wherein said measurements are alignment measurements for use in positioning said pattern relative to features already present on the substrate.

34. A computer program product containing one or more sequences of machine-readable instructions for causing a processing device or system of processing devices to control the measurement system to perform the method according to any of clauses 1 to 31 in an apparatus according to any of clauses 31 to 33.

35. A metrology apparatus arranged to obtain measurements of one or more properties of structures at a selected set of locations across a substrate using a method according to any of clauses 1 to 30.

36. A computer program product containing one or more sequences of machine-readable instructions for causing a processing device or system of processing devices to control a metrology apparatus to perform the method according to any of clauses 1 to 30 in an apparatus according to clause 35.

37. A method of manufacturing devices including a lithographic process step, wherein, before or after performing said lithographic process step, measurements are obtained at a selected set of locations across a substrate by a method according to any of clauses 1 to 30, and wherein the obtained measurements are used to adjust parameters of the lithographic process step for the processing of the substrate and/or further substrates.

38. A method of determining a weighting factor for a measurement made at a measurement location on a substrate, the method comprising the steps of:
    applying a quality test to the measurement, the quality test being based at least partly on supplementary data associated with the measurement location; and
    determining the weighting factor based on a result of said quality test.

39. A method according to clause 38 wherein said supplementary data comprises statistical data based on previously processed substrates.

40. A method according to clause 39 wherein said statistical data represents a variation of measurements across the previously processed substrates, and the quality test is based on a comparison of the measurement with the variation seen at corresponding locations on the previously processed substrates.

41. A method according to clause 40 wherein the variation is determined using residual values relative to a fitted model.

42. A method according to clause 39 wherein said statistical data represents a set of component vectors describing spatial distributions of measurements of the previously processed substrates.

43. A method according to clause 42 wherein the quality test compares the measurement with a value predicted by one or more of the component vectors.

44. A method according to any of clauses 39 to 43 wherein an outlier measurement identified using said quality test is replaced with a value based at least partly on the statistical data.

45. A method according to any of clauses 38 to 45 wherein the quality test is based at least partly on height data measured on the substrate.

46. A method according to any of clauses 38 to 45 wherein a zero weighting is applied to an outlier measurement identified using said quality test.

47. A method according to any of clauses 38 to 46 wherein an outlier measurement identified using said quality test is replaced with a measurement at a neighboring position.

48. A computer program product containing one or more sequences of machine-readable instructions for causing a processing device or system of processing devices to receive measurements made at locations across a substrate and to perform the method according to any of clauses 38 to 47 to determine a weighting factor for the measurements.

49. A metrology apparatus arranged to obtain measurements of one or more properties of structures at a selected set of locations across a substrate, the metrology apparatus being further arranged to apply a weighting factor to the measurements using a method according to any of clauses 38 to 47.

50. A method of manufacturing devices including a lithographic process step, wherein, before or after performing said lithographic process step, measurements are obtained at a selected set of locations across a substrate, wherein weighing factors for said measurements are obtained by a method according to any of clauses 38 to 47, and wherein the obtained measurements modified in accordance with the weighting factors are used to adjust parameters of the lithographic process step for the processing of the substrate and/or further substrates.

CONCLUSION

In conclusion, the present disclosure provides a method of obtaining measurements from locations across a substrate, or a number of substrates, in which dynamic selection of measurement locations is applied to increase the relevance of the obtained measurements. In particular, rather than applying a fixed sampling scheme on a substrate, a substrate-specific sampling scheme can be applied, which is determined dynamically in response to a few initial measurements. Defining the set of measurement locations dynamically in response to the result of measurements at a preliminary selection of measurement locations allows more effective use of the available budget of measurement time.

The type of measurements made at the dynamically selected set of measurement locations may be the same as or different than the type of measurements made at the preliminary selection of measurement locations. Where the types are the same, the measurements made at the preliminary selection of locations can be combined with those made at the dynamically selected locations, to make a single set of measurements for analysis.

The disclosed method allows the provision of a lithographic apparatus and methods of operating a lithographic apparatus in which performance parameters such as overlay can be improved, without the need for additional measurements, or even with a reduced number of measurements. The dynamic selection can be performed with or without using additional context information. Throughput can be maintained and/or increased, without the loss of performance that might otherwise result.

In other embodiments, the disclosed method allows the provision of a metrology apparatus and methods of operating metrology apparatus in which more relevant measurement of performance parameters of the lithographic process can be obtained, without the need for additional measurements (or with a reduced number of measurements). Throughput can be maintained and/or increased, without the loss of measurement usefulness that might otherwise result.

According to the second aspect of the disclosure, outliers can be detected and de-weighted or removed, more reliably using supplementary data of one or more types. The method does not need new hardware; it can be applied by adapting software and the way of working. It uses the available information that may be present already in the lithography tool or metrology tool, or at least in the connected control system of the tool. It need have no negative impact on the throughput, unless it is required to repeat measurements at different locations to substitute for the outlier measurements. In performance terms, reduction of wafer-to-wafer variation in overlay (or other performance parameters) may be obtained. By reducing variation in the reported data, there is also less the noise in control loops (APC loops). By eliminating overlay errors caused by wafer alignment outliers, the yield/rework rate is improved. Similar benefits can be obtained when the method is applied to detect outliers in overlay metrology.

An embodiment of the invention in any of the aspects described may be implemented using a computer program containing one or more sequences of machine-readable instructions describing methods of recognizing characteristics in position data obtained by alignment sensors, and applying corrections as described above. This computer program may be executed for example within the control unit LACU of FIG. 1, or some other controller, for example within the metrology apparatus 140. There may also be provided a data storage medium (e.g., semiconductor memory, magnetic or optical disk) having such a computer program stored therein.

The breadth and scope of the present invention should not be limited by any of the above-described exemplary embodiments, but should be defined only in accordance with the following claims and their equivalents.

The invention claimed is:

1. A method of obtaining measurements from locations across a substrate before or after performing a lithographic process step, wherein a set of measurement locations is selected from among all possible measurement locations, and at each selected measurement location a measurement is made of a property of a structure on the substrate after a first materials processing of the substrate and before a physical or chemical change to the substrate by a successive second materials processing of the substrate, the first materials processing being of a different type than the second materials processing, wherein at least a subset of the selected measurement locations is selected dynamically at least partly in response to recognition of a fingerprint associated with measurements of the same substrate obtained after the same first materials processing of the substrate and before the same physical or chemical change to the substrate by the second materials processing of the substrate, using a preliminary selection of measurement locations.

2. The method as claimed in claim 1, wherein the preliminary selection of measurement locations includes a first subset of the selected set of measurement locations, and a second subset of the selected set of measurement locations is selected dynamically in response to the measurements obtained using the preliminary selection.

3. The method as claimed in claim 1, wherein the number of measurement locations in the preliminary selection comprises fewer than one half of the number of measurement locations in the selected set.

4. The method as claimed in claim 1, wherein the dynamically selected subset of measurement locations includes at least one location selected by recognition of: a) a statistically exceptional measurement at one of the selected measurement locations, or b) a statistically exceptional distribution of measurements over a plurality of the selected measurement locations.

5. The method as claimed in claim 1, wherein the dynamically selected subset of measurement locations is determined at least partially in response to a gradient observed over a plurality of the selected measurement locations.

6. The method as claimed in claim 1, wherein the dynamically selected subset is selected in part based on context information received with the substrate.

7. The method as claimed in claim 1, further comprising applying a quality test to the measurements, and applying a zero or reduced weighting to one or more measurements identified as outliers based on a result of the quality test.

8. The method as claimed in claim 7, wherein the quality test is based on a comparison of the measurements with statistical data based on previously processed substrates.

9. The method as claimed in claim 7, wherein the quality test is based at least partly on height data measured on the substrate.

10. The method as claimed in claim 9, wherein the outlier measurement is replaced with a measurement made at a neighboring position to where the outlier measurement was taken.

11. The method as claimed in claim 1, wherein the measurements are position measurements made after loading a substrate into a lithographic apparatus, and further comprising applying a pattern to the substrate using the position measurements.

12. The method as claimed in claim 11, wherein measurement locations of in-plane positional deviations are selected dynamically, in response to height measurements obtained using the preliminary selection of measurement locations.

13. The method as claimed in claim 12, wherein measurement locations of in-plane positional deviations are selected dynamically, in response to gradients observed in the height measurements.

14. A non-transitory computer readable medium having instructions that, when executed by a computer system, are configured to cause the computer system to at least obtain measurements from locations across a substrate before or after performing a lithographic process step, wherein a set of measurement locations is selected from among all possible measurement locations, and at each selected measurement location a measurement is made of a property of a structure on the substrate after a first materials processing of the substrate and before physical or chemical change to the substrate by a successive second materials processing of the substrate, the first materials processing being of a different type than the second materials processing, wherein at least a subset of the selected measurement locations is selected dynamically at least partly in response to recognition of a fingerprint associated with measurements of the same substrate obtained after the same first materials processing of the substrate and before the same physical or chemical change to the substrate by the second materials processing of the substrate, using a preliminary selection of measurement locations.

15. The non-transitory computer readable medium of claim 14, wherein the preliminary selection of measurement locations includes a first subset of the selected set of measurement locations, and the instructions are further configured such that a second subset of the selected set of measurement locations is selected dynamically in response to the measurements obtained using the preliminary selection.

16. The non-transitory computer readable medium of claim 14, wherein the number of measurement locations in the preliminary selection comprises fewer than one half of the number of measurement locations in the selected set.

17. The non-transitory computer readable medium of claim 14, wherein the dynamically selected subset of measurement locations includes at least one location selected by recognition of: a) a statistically exceptional measurement at one of the selected measurement locations, or b) a statistically exceptional distribution of measurements over a plurality of the selected measurement locations.

18. The non-transitory computer readable medium of claim 14, wherein the dynamically selected subset of measurement locations is determined at least partially in response to a gradient observed over a plurality of the selected measurement locations.

19. An apparatus configured to perform a process step in a lithographic process, the apparatus comprising:
the non-transitory computer readable medium of claim 14; and
a measurement system configured to make measurement of the substrate prior to performing the process step, the measurement system arranged to obtain measurements at the selected set of locations across the substrate.

20. A metrology apparatus arranged to obtain measurements of one or more properties of structures at a selected set of locations across a substrate using the non-transitory computer readable medium of claim 14.

21. A non-transitory computer readable medium having instructions that, when executed by a computer system, are configured to cause the computer system to at least:
obtain measurements from locations across a substrate before or after performing a lithographic process step, wherein a set of measurement locations is selected from among all possible measurement locations, and at each selected measurement location a measurement is made of a property of a structure on the substrate, wherein at least a subset of the selected measurement locations is selected dynamically at least partly in response to recognition of a fingerprint associated with measurements of the same substrate obtained using a preliminary selection of measurement locations;
apply a quality test to the measurements;
apply a zero or reduced weighting to a measurement identified from the measurements as an outlier based on a result of the quality test.

22. The computer readable medium as claimed in claim 21, wherein the quality test is based on a comparison of the measurements with statistical data based on previously processed substrates.

23. The computer readable medium as claimed in claim 21, wherein the quality test is based at least partly on height data measured on the substrate.

24. The computer readable medium as claimed in claim 23, wherein the outlier measurement is replaced with a measurement made at a neighboring position to where the outlier measurement was taken.

* * * * *